(12) United States Patent
Wu

(10) Patent No.: US 6,746,918 B2
(45) Date of Patent: Jun. 8, 2004

(54) METHODS OF FABBRICATING A STACK-GATE NON-VOLATILE MEMORY DEVICE AND ITS CONTACTLESS MEMORY ARRAYS

(75) Inventor: Ching-Yuan Wu, Hsinchu (TW)

(73) Assignee: Silicon Based Technology Corp., Hsinchu (TW)

( * ) Notice: Subject to any disclaimer, the term of this patent is extended or adjusted under 35 U.S.C. 154(b) by 24 days.

(21) Appl. No.: 10/170,453

(22) Filed: Jun. 14, 2002

(65) Prior Publication Data
US 2003/0232472 A1 Dec. 18, 2003

(51) Int. Cl.[7] .......................... H01L 21/336
(52) U.S. Cl. .............. 438/257; 438/201; 438/211; 438/262; 257/314
(58) Field of Search ............... 257/314, 315, 257/316, 317, 318, 319, 320, 321; 438/201, 211, 257 V, 266, 262, 267

(56) References Cited

U.S. PATENT DOCUMENTS

| | | | | |
|---|---|---|---|---|
| 4,698,787 | A | | 10/1987 | Mukherjee et al. |
| 6,211,012 | B1 | | 4/2001 | Lee et al. |
| 6,211,020 | B1 | | 4/2001 | Tripsas et al. |
| 6,221,718 | B1 | | 4/2001 | Hong |
| 6,255,205 | B1 | * | 7/2001 | Sung ........................ 438/595 |
| 6,436,764 | B1 | * | 8/2002 | Hsieh ....................... 438/257 |
| 6,469,348 | B2 | * | 10/2002 | Shimizu .................... 257/345 |
| 6,512,263 | B1 | * | 1/2003 | Yuan et al. ................ 257/316 |
| 6,555,869 | B2 | * | 4/2003 | Park ......................... 257/315 |
| 6,593,177 | B2 | * | 7/2003 | Lee .......................... 438/201 |
| 6,608,347 | B2 | * | 8/2003 | Sato ......................... 257/316 |
| 2002/0017692 | A1 | * | 2/2002 | Shimizu et al. ............ 257/390 |
| 2003/0042532 | A1 | * | 3/2003 | Forbes ....................... 257/316 |
| 2003/0068859 | A1 | * | 4/2003 | Leung et al. ............... 438/257 |
| 2003/0155599 | A1 | * | 8/2003 | Hsu et al. .................. 257/296 |

* cited by examiner

Primary Examiner—Long Pham
Assistant Examiner—Thao X. Le
(74) Attorney, Agent, or Firm—Pro Techtor International Services

(57) ABSTRACT

A stack-gate non-volatile memory device with a tapered floating-gate structure is disclosed by the present invention, in which the tapered floating-gate structure offers a longer effective channel length to alleviate the punch-through effect and a larger surface area for erasing or programming between the tapered floating-gate structure and the integrated common-source/drain conductive structure. The stack-gate non-volatile memory devices of the present invention are implemented into three contactless array architectures: a contactless NOR-type array, a contacless NAND-type array, and a contactless parallel common-source/drain conductive bit-lines array. The features and advantages of the contactless memory arrays are a smaller cell size of $4F^2$, a smaller common-source/drain bus-line resistance and capacitance, a higher erasing speed, and a smaller bit/word-line resistance and capacitance, as compared to the prior arts.

20 Claims, 13 Drawing Sheets

METHODS OF FABBRICATING A STACK-GATE NON-VOLATILE MEMORY DEVICE AND ITS CONTACTLESS MEMORY ARRAYS

BACKGROUND OF THE INVENTION

1. Field of the Invention

The present invention relates generally to a method of fabricating a scaled non-volatile semiconductor memory device and, more particularly, to methods of fabricating a stack-gate non-volatile semiconductor memory device having a tapered floating-gate structure and its contactless memory arrays for high-density mass storage applications.

2. Description of Related Art

A non-volatile semiconductor memory device is known to store charges in an isolated gate being known as a floating gate by means of either Fowler-Nordheim tunneling or hot-electron injection through a thin tunneling-dielectric layer from a semiconductor substrate for programming and to remove or erase charges stored in the isolated gate by means of Fowler-Nordheim tunneling through a thin tunneling-dielectric layer to the source diffusion region of a semiconductor substrate or a control gate. Basically, the cell size of a non-volatile semiconductor memory device must be scaled down for high-density mass storage applications and the cell structure must be developed toward low-voltage, low-current and high-speed operation with high endurance and high retention.

In general, the non-volatile semiconductor memory devices of the prior arts can be divided into two categories, based on the cell structure: a stack-gate structure and a split-gate structure. The stack-gate structure is known to be a one-transistor cell, in which the gate length of a cell can be defined by using a minimum-feature-size (F) of technology used. However, the split-gate structure including a floating gate and a select gate is known to be a 1.5-transistor cell. Therefore, the stack-gate structure is more suitable for high-density mass storage applications than the split-gate structure.

FIG. 1A shows a cross-sectional view of a stack-gate non-volatile semiconductor memory device in the channel-length direction, in which a thin tunneling-oxide layer 101 is formed over a semiconductor substrate 100; a doped polycrystalline-silicon layer 102 being acted as a floating gate is formed over the thin tunneling-oxide layer 101; an intergate-dielectric layer 103 of preferably an oxide-nitride-oxide (ONO) structure is formed on the floating gate 102; a doped polycrystalline-silicon layer 104 capped with a silicide layer either using polycide or salicide technology is formed over the intergate-dielectric layer 103 to act as a control gate; a source diffusion region is formed with a double-diffused structure having a shallow heavily-doped diffusion region 106a formed within a deeper moderately-doped diffusion region 105a; a drain diffusion region 106b is formed by a shallow heavily-doped diffusion region in the semiconductor substrate 100; and a pair of sidewall dielectric spacers 106 are formed over sidewalls of a gate stack.

Basically, the operation principle of a stack-gate non-volatile semiconductor memory device shown in FIG. 1A had been described by Mukherjee et al. in U.S. Pat. No. 4,698,787. The programming of a stack-gate non-volatile semiconductor memory device shown in FIG. 1A can be accomplished by applying a relatively high positive-voltage to a control gate 104, a moderately high positive-voltage to a drain 106b, and a source 106a is grounded. A high lateral electric field near the drain edge is used to generate hot-electrons and the generated hot-electrons with an energy higher than the interface barrier between the conduction bands of a thin tunneling-oxide layer 101 and the semiconductor substrate 100 are injected into a floating gate 102 and stored there. The erasing of the stack-gate non-volatile semiconductor memory device shown in FIG. 1A can be accomplished by applying a relatively high negative-voltage to the control gate 104 and a moderately high positive-voltage to the source 106a, and the drain 106b is usually kept floating. The stored electrons in the floating gate 102 are then tunneling from the floating gate 102 to the double-diffused source structure 106a, 105a by a high electric field across the thin tunneling-oxide layer 101 over the double-diffused source structure. The double-diffused source structure is mainly used to eliminate the band-to-band tunneling effects during erasing and a deeper double-diffused source junction is therefore needed to have a large overlapping area for a thin tunneling-oxide layer in order to increase the erasing speed.

Apparently, as the gate length of a stack-gate non-volatile semiconductor memory device shown in FIG. 1A is scaled for high-density mass storage applications, there is an important issue encountered: the deeper double-diffused source structure becomes an obstacle for a scaled stack-gate length because the punch-through effect becomes serious for programming using hot-election injection as stated above. It is, therefore, an objective of the present invention to provide a non-volatile semiconductor memory device having a tapered floating-gate structure and its fabrication method for a scaled stack-gate length to alleviate the problems encountered by the prior arts.

As the stack-gate non-volatile semiconductor memory device shown in FIG. 1A is implemented as a cell of a memory array, for example: a NOR-type memory array, the source of the stack-gate non-volatile semiconductor memory devices in a column are connected each other by a common-source line (SL) and the nearby two columns use the same common-source line (SL). The common-source line (SL) for nearby two columns is in general implemented by first completely removing the field-oxides in the field-oxide isolation regions using a non-critical masking step and then implanting doping impurities into a semiconductor substrate to form a buried common-source line. FIG. 1B shows a cross-sectional view along a buried common-source line for LOCOS isolation. It is clearly shown that a non-uniform doping depth 106c, 106d would occur over the side-slope formed by LOCOS, resulting in higher buried common-source line resistance. This phenomenon would be more serious for shallow-trench-isolation (STI) when compared to LOCOS isolation, as shown in FIG. 1C.

There are several methods proposed to improve the buried common-source line resistance. U.S. Pat. No. 6,211,020 B1 had proposed a plasma implantation technique to improve the non-uniform doping depth resulting from conventional ion-implantation. However, the buried common-source line resistance is still high because the junction depth of a plasma implantation will be limited by the source junction depth of a scaled non-volatile semiconductor memory device. Moreover, a large junction capacitance of the buried common-source line together with a high parasitic resistance of the buried common-source line may reduce the operation speed of a non-volatile semiconductor memory array for high-density mass storage applications. U.S. Pat. No. 6,221,718 B1 had proposed the parallel common bit-lines for the source/drain diffusion regions of all cells using a doped polycrystalline-silicon layer. The doped polycrystalline-silicon layer must be thinner than the thickness of the floating gate in order to run an intergate ONO layer and a control gate. It is clearly seen from the formed structure that a very high parasitic capacitance between the control gate and the common bit-lines is expected. U.S. Pat. No. 6,211, 012 B1 had described a conductive layer including tungsten, aluminum or doped polycrystalline-silicon as the common-source lines and the landing pads for the bit-line contacts. A planarized CVD-oxide layer and a critical alignment mask step are required to pattern the landing pads. Moreover, a critical mask is also required to register the stack-gate over the pre-isolated substrate shown. It is, therefore, another objective of the present invention to provide a contactless structure with the common-source/drain conductive bus lines having very low common bus-line resistance and capacitance, and the highly conductive landing islands for the scaled stack-gate non-volatile semiconductor memory arrays in high-density mass storage applications.

SUMMARY OF THE INVENTION

A stack-gate non-volatile memory device and its contactless memory arrays are disclosed by the present invention. The stack-gate non-volatile memory device of the present invention comprises a stack-gate structure having a tapered floating-gate layer being formed over a first gate-dielectric layer; a first sidewall dielectric layer being formed over each sidewall of the tapered floating-gate layer, a second sidewall dielectric layer being formed over each sidewall of a control-gate layer, and a second gate-dielectric layer being formed over a semiconductor substrate in each side portion of the stack-gate structure; a source diffusion region and a drain diffusion region being separately or simultaneously formed in a self-aligned manner by implanting doping impurities across the tapered floating-gate structure with or without the first sidewall dielectric layers and the second gate-dielectric layers to form the graded doping profiles in the semiconductor substrate; a sidewall conductive electrode capped with a dielectric layer being formed over each of the first sidewall dielectric layers and on the second gate-dielectric layers; and a first sidewall dielectric spacer being formed over each sidewall of the stack-gate structure and on the first dielectric layers to define the sidewall conductive electrodes and the source/drain contact regions. The stack-gate non-volatile memory device as described is used to implement three contactless memory arrays: a contactless NOR-type memory array, a contactless NAND-type memory array, and a contactless parallel common-source/drain conductive bit-lines memory array.

The contactless NOR-type memory array of the present invention comprises a plurality of active regions and a plurality of shallow-trench-isolation (STI) regions being alternately formed on a semiconductor substrate of a first conductivity type; a plurality of stack-gate non-volatile memory devices being formed on the semiconductor substrate, wherein a plurality of elongated control-gate layers being formed transversely to the plurality of STI regions are acted as a plurality of word lines; a plurality of common-source conductive bus lines being formed over a plurality of first flat beds, wherein each of the plurality of first flat beds being formed between a pair of first sidewall dielectric spacers is alternately formed by an etched first raised field-oxide layer and a heavily-doped source diffusion region of a second conductivity type formed within a common-source diffusion region of the second conductivity type and each of the plurality of common-source conductive bus lines is integrated with the source-sidewall conductive electrodes of nearby stack-gate non-volatile memory devices; a plurality of planarized common-drain conductive islands being formed over a plurality of second flat beds, wherein each of the plurality of second flat beds being formed between another pair of first sidewall dielectric spacers and alternately formed by an etched first raised field-oxide layer and a heavily-doped drain diffusion region of the second conductivity type formed within a common-drain diffusion region of the first or second conductivity type, and each of the plurality of planarized common-drain conductive islands is integrated with a pair of drain-sidewall conductive electrodes of nearby stack-gate non-volatile memory devices; and a plurality of bit lines integrated with the plurality of planarized common-drain conductive islands being formed alternately and transversely to the plurality of common-source conductive bus lines, wherein each of the plurality of bit lines together with the plurality of planarized common-drain conductive islands in a column are simultaneously patterned and etched by a masking dielectric layer being aligned to each of the plurality of active regions and two sidewall dielectric spacers being formed over each sidewall of the masking dielectric layer.

The contactless NAND-type memory array of the present invention comprises a plurality of active regions and a plurality of STI regions being alternately formed on a semiconductor substrate of a first conductivity type; a plurality of stack-gate non-volatile memory devices being formed on the semiconductor substrate, wherein a plurality of elongated control-gate conductive layers being formed transversely to the plurality of STI regions are acted as a plurality of word lines; a plurality of self-registered common-source conductive islands being formed on a plurality of heavily-doped source diffusion regions of a second conductivity type formed within a plurality of common-source diffusion regions of the second conductivity type, wherein each of the plurality of self-registered common-source conductive islands being formed between a pair of first sidewall dielectric spacers and nearby second raised field-oxide layers is integrated with the source-sidewall conductive electrodes of nearby stack-gate non-volatile memory devices; a plurality of self-registered common-drain conductive islands being formed on a plurality of heavily-doped drain diffusion regions of the second conductivity type formed within a plurality of common-drain diffusion regions of the second conductivity type, wherein each of the plurality of self-registered common-drain conductive islands being formed between another pair of first sidewall dielectric spacers and nearby second raised field-oxide layers is integrated with the drain-sidewall conductive electrodes of nearby stack-gate non-volatile memory devices; and a plurality of bit lines being formed alternately and transversely to the plurality of word lines, wherein each of the plurality of bit lines is patterned and etched by a masking dielectric layer being aligned to each of the plurality of active regions and two sidewall dielectric spacers being formed over each sidewall of the masking dielectric layer.

The contactless parallel common-source/drain conductive bit-lines memory array of the present invention comprises a plurality of active regions and a plurality of STI regions being alternately formed on a semiconductor substrate of a first conductivity type; a plurality of stack-gate non-volatile memory devices being formed on the semiconductor substrate; a plurality of common-source conductive bus lines being formed over a plurality of first flat beds, wherein each of the plurality of first flat beds being formed between a pair of first sidewall dielectric spacers is alternately formed by an etched first raised field-oxide layer and a heavily-doped source diffusion region of a second conductivity type formed within a common-source diffusion region of the second conductivity type and each of the plurality of common-source conductive bus lines is integrated with the source-sidewall conductive electrodes of nearby stack-gate non-volatile memory devices; a plurality of common-drain conductive bus lines being formed over a plurality of second flat beds, wherein each of the plurality of second flat beds being formed between another pair of first sidewall dielectric spacers is alternately formed by an etched first raised field-oxide layer and a heavily-doped drain diffusion region of the second conductivity type formed within a common-drain diffusion region of the first conductivity type and each of the plurality of common-drain conductive bus lines is integrated with the drain-sidewall conductive electrodes of nearby stack-gate non-volatile memory devices; and a plurality of word lines being formed transversely to the plurality of common-source/drain conductive bus lines, wherein each of the plurality of word lines being integrated with a plurality of control-gate conductive islands is simultaneously patterned and etched by a masking dielectric layer being aligned to each of the plurality of active regions and two sidewall dielectric spacers being formed over each sidewall of the masking dielectric layer.

BRIEF DESCRIPTION OF THE DRAWINGS

FIG. 1A through FIG. 1C show the schematic diagrams of the prior arts, in which FIG. 1A shows a cross-sectional view of a typical stack-gate flash memory device of the prior art; FIG. 1B shows a cross-sectional view along a common-source line of the prior art for LOCOS isolation; and FIG. 1C shows a cross-sectional view along a common-source line of the prior art for STI isolation.

FIG. 2A(b) shows a top plan view of a contactless NAND-type flash memory array; FIG. 2A(c) shows a top plan view of a contactless parallel common-source/drain conductive bit-lines flash memory array; FIG. 2B(a) shows a cross-sectional view of a pair of stack-gate non-volatile memory devices along the A–A' line shown in FIG. 2A(a); FIG. 2B(b) shows a cross-sectional view of a pair of stack-gate non-volatile memory devices along the A–A' line shown in FIG. 2A(b); and FIG. 2B(c) shows a cross-sectional view of a pair of stack-gate non-volatile memory devices along the A–A' line shown in FIG. 2A(c).

DETAILED DESCRIPTION OF THE PREFERRED EMBODIMENTS

Figure 1A:
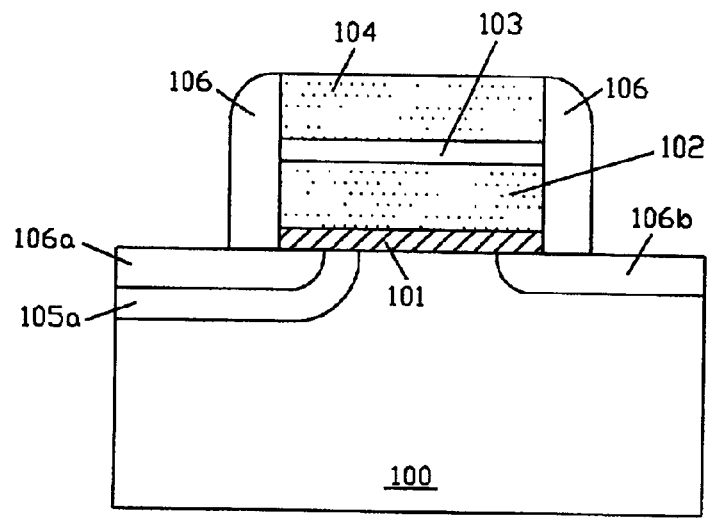
Figure 1B:
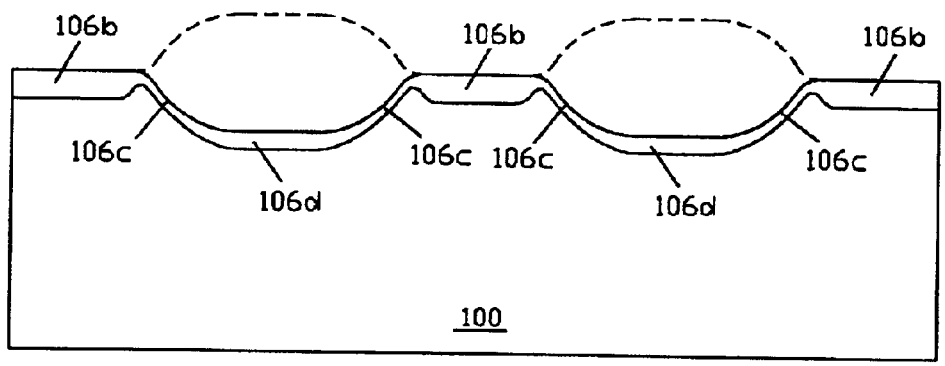
Figure 1C:
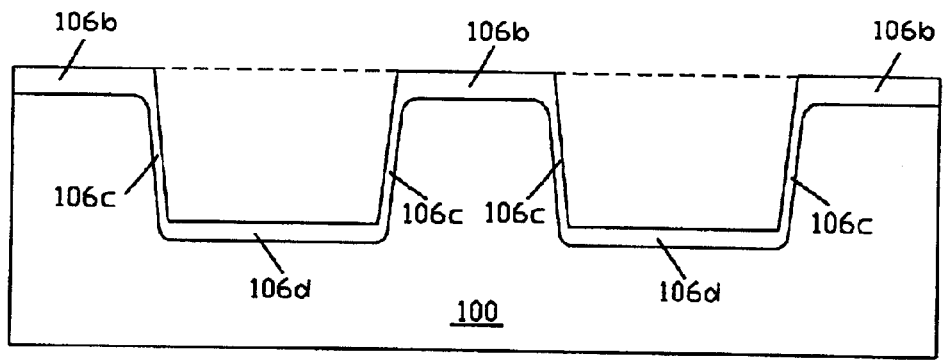
Figure 2A:
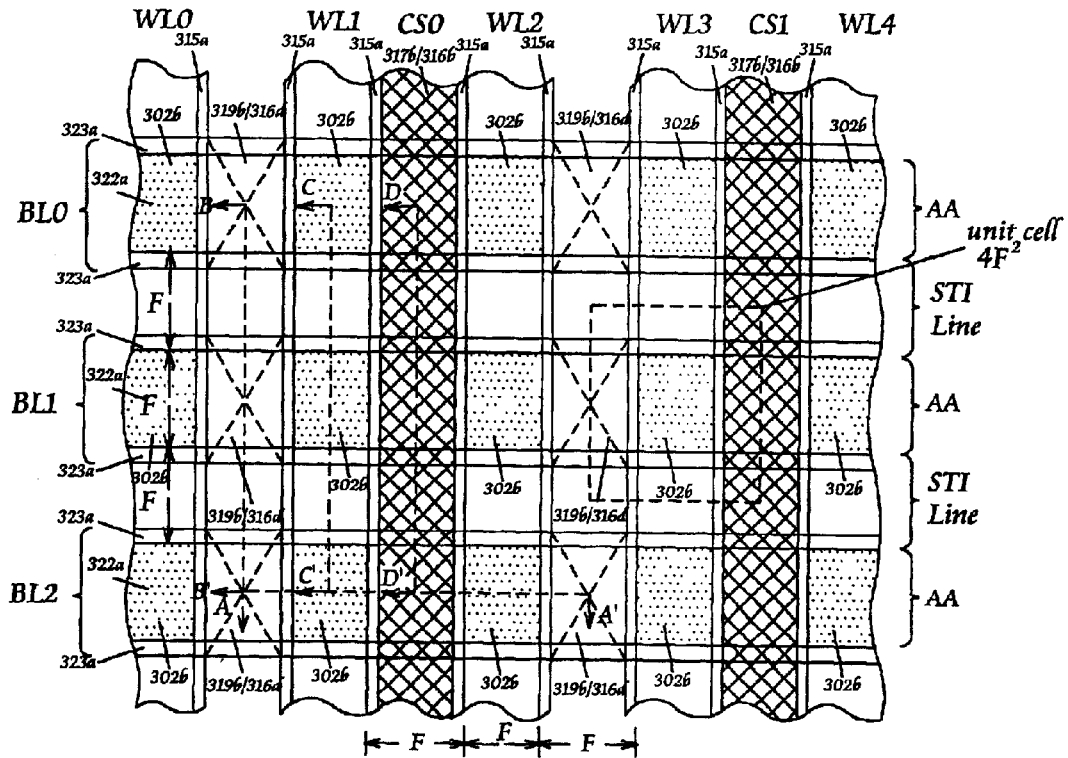
FIG. 2A and FIG. 2B show the schematic diagrams of the present invention, in which FIG. 2A(a) shows a top plan view of a contactless NOR-type flash memory array.
Figure 2A:
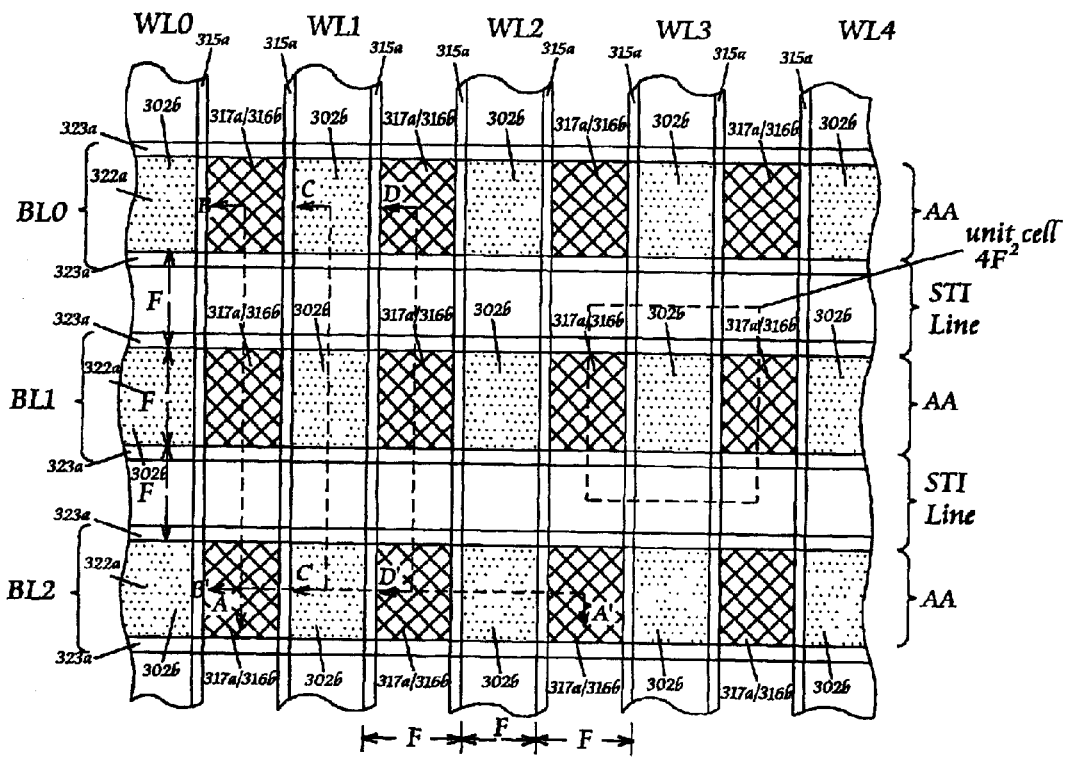
Figure 2A:
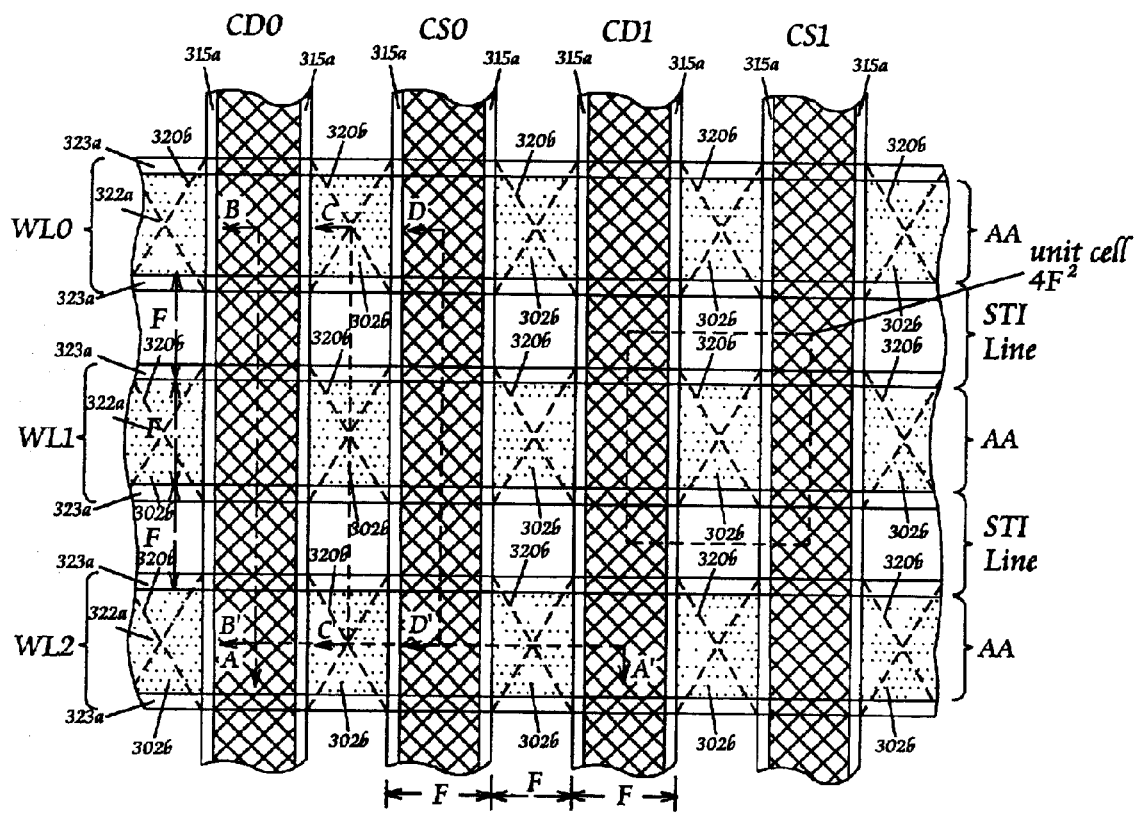

Referring now to FIG. 2A(a) through FIG. 2A(c), there are shown the top plan views of the contactless flash memory arrays of the present invention, in which FIG. 2A(a) shows a top plan view of a contactless NOR-type flash memory array; FIG. 2A(b) shows a top plan view of a contactless NAND-type flash memory array; and FIG. 2A(c) shows a top plan view of a contactless parallel common-source/drain conductive bit-lines flash memory array.

Figure 2B:
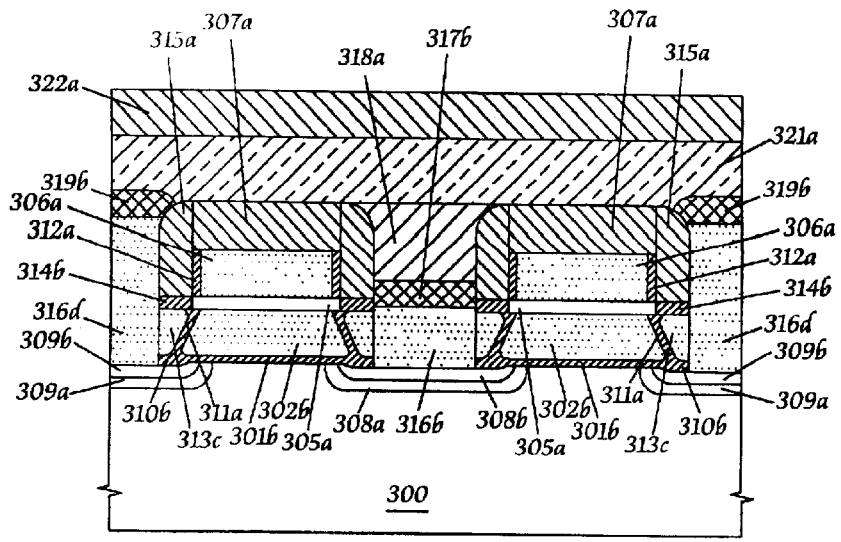
Figure 2B:
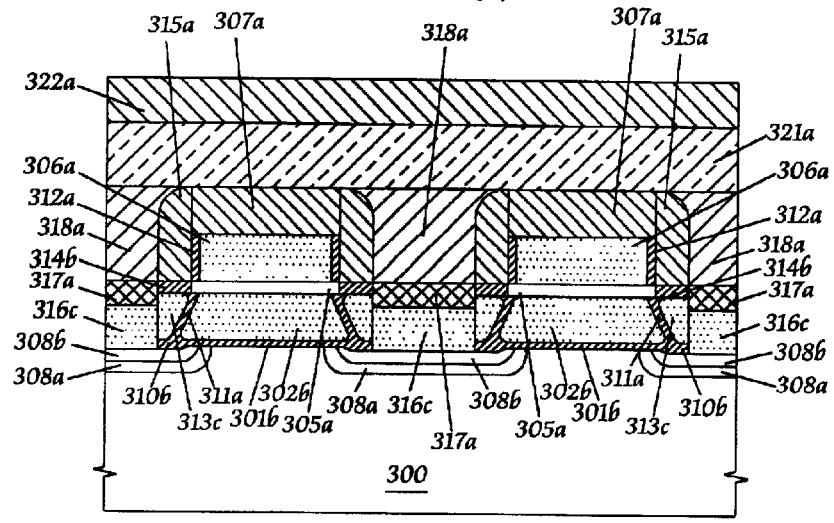
Figure 2B:
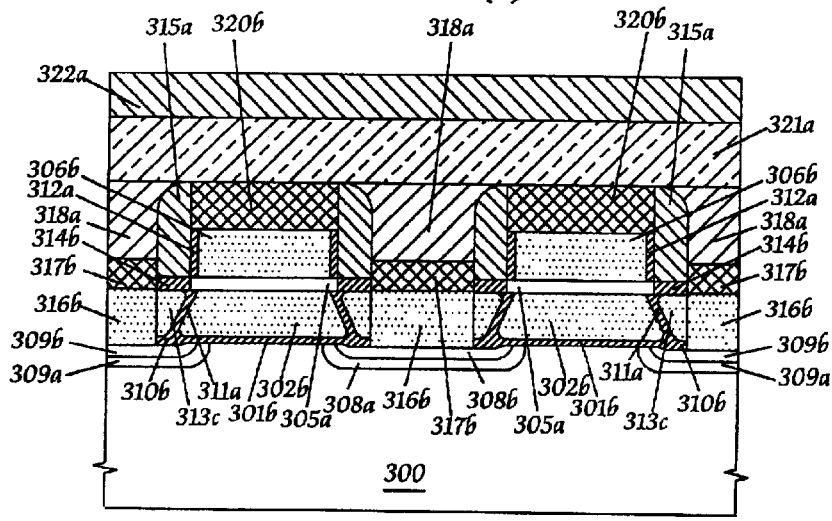

FIG. 2A(a) shows a first embodiment of the present invention, in which a plurality of active regions (AA's) and a plurality of shallow-trench-isolation (STI) regions (STI lines) are formed alternately on a semiconductor substrate 300 of a first conductivity type; a plurality of common-source conductive bus lines (CS0 and CS1) 317b/316b integrated with the source-sidewall conductive electrodes 313c are formed alternately and transversely to the plurality of STI regions (STI lines), wherein each of the plurality of common-source conductive bus lines (CS0 and CS1) 317b/316b is formed between a pair of first sidewall dielectric spacers 315a and on a first flat bed being alternately formed by a heavily-doped source diffusion region 308b (see FIG. 2B(a)) of a second conductivity type formed within a common-source diffusion region 308a (see FIG. 2B(a)) of the second conductivity type and an etched first raised field-oxide layer 304d(see FIG. 5A); a plurality of stack-gate non-volatile memory devices having a tapered floating-gate structure 302b are alternately formed on the plurality of active regions with an elongated control-gate layer 306a being acted as a word line (WL) and a plurality of word lines (WL0~WL4) are formed alternately and transversely to the plurality of STI regions (STI lines); a plurality of planarized common-drain conductive islands 319b/316d as marked by the dash cross symbols being integrated with a first interconnect-metal layer 321a (see FIG. 2B(a)) are simultaneously patterned and etched to form a bit line (BL) by using a masking dielectric layer 322a being aligned to each of the plurality of active regions and two sidewall dielectric spacers 323a being formed over each sidewall of the masking dielectric layer 322a and a plurality of bit lines (BL0~BL2) are formed alternately and transversely to the plurality of common-source conductive bus lines (CS0, CS1) 317b/316b, wherein each of the plurality of planarized common-drain conductive islands 319b/316d integrated with the drain-sidewall conductive electrodes 313c (see FIG. 2B(a)) is formed over a second flat bed being alternately formed by the etched first raised field-oxide layer 304d and a heavily-doped drain diffusion region 309b of the second conductivity type formed within a common-drain diffusion region 309a of the first or second conductivity type. As shown in FIG. 2A(a), the unit cell size as marked by a dash square is $4F^2$. The cross-sectional view along the A–A' line as shown in FIG. 2A(a) is shown in FIG. 2B(a) and the cross-sectional views along the B–B' line, the C–C' line, and the D–D' line are separately shown in FIG. 5A through FIG. 5C.

FIG. 2A(b) shows a second embodiment of the present invention, in which a plurality of active regions (AA's) and a plurality of STI regions (STI lines) are formed alternately on a semiconductor substrate 300 of a first conductivity type; a plurality of stack-gate non-volatile memory devices having a tapered floating-gate structure 302b are alternately formed on the plurality of active regions with an elongated control-gate layer being acted as a word line (WL) and a plurality of word lines (WL0~WL4) are formed alternately and transversely to the plurality of STI regions (STI lines); a plurality of self-registered common-source/drain conductive islands 317a/316c (see FIG. 2B(b)) are formed separately on a plurality of heavily-doped source/drain diffusion regions 308b (see FIG. 2B(b)) of the second conductivity type formed within a plurality of common-source/drain diffusion regions 308b of the second conductivity type and each of the plurality of self-registered common-source/drain conductive islands are formed between a pair of first sidewall dielectric spacers 315a and a pair of third raised field-oxide layers 304e (see FIG. 6A), wherein each of the plurality of common-source/drain conductive islands 317a/316c is integrated with the source/drain-sidewall conductive electrodes 313c; a plurality of common-source conductive bus lines (CS's) (not shown) are formed alternately and transversely to the plurality of STI regions (STI lines), wherein each of the plurality of common-source conductive bus lines (CS's) is formed between a pair of first-sidewall dielectric spacers 315a being formed over each sidewall of nearby source select transistors and over a first flat bed being alternately formed by a heavily-doped source diffusion region 308b of the second conductivity type formed within a common-source diffusion region 308a of the second conductivity type and an etched first raised field-oxide layer 304d; a plurality of planarized common-drain conductive islands 319b/316c (not shown) being integrated with a first interconnect-metal layer 321a (see FIG. 2B(b)) are simultaneously pattered and etched to form a bit line (BL) by using a masking dielectric layer 322a being aligned to each of the plurality of active regions and two sidewall dielectric spacers 323a being formed over each sidewall of the masking dielectric layer 322a and a plurality of bit lines (BL0~BL2) are formed alternately and transversely to the plurality of common-source conductive bus lines (CS's) 317b/316b, wherein each of the plurality of planarized common-drain conductive islands 317a/316c (see FIG. 2B(b)) is formed between another pair of first sidewall dielectric spacers 315a being formed over each sidewall of nearby drain select-transistors and over a second flat bed being alternately formed by a heavily-doped drain diffusion region 308b (see FIG. 2B(b)) of the second conductivity type formed within a common-drain diffusion region 308a (see FIG. 2B(b)) of the second conductivity type. As shown in FIG. 2A(b), a plurality of stack-gate non-volatile memory devices are interconnected in series to form a plurality of bytes in parallel by using the heavily-doped source/drain diffusion regions 308b formed within the common-source/drain diffusion regions 308a and their self-registered common-source/drain conductive islands 317a/316c, wherein each byte can be 16 bits, 32 bits, 64 bits, or more. FIG. 2A(b) shows that the unit cell size as marked by a dash square is 4F², however, each byte needs a source select-transistor, a drain select-transistor, a common-source conductive bus line, and a planarized common-drain conductive island. The cross-sectional view along the A–A' line as shown in FIG. 2A(b) is shown in FIG. 2B(b) and the cross-sectional views along the B–B' line, the C–C' line, and the D–D' line are separately shown in FIG. 6A through FIG. 6C.

FIG. 2A(c) shows a third embodiment of the present invention, in which a plurality of active regions (AA's) and a plurality of STI regions (STI lines) are formed alternately on a semiconductor substrate 300 of a first conductivity type; a plurality of common-source conductive bus lines (CS0, CS1) and a plurality of common-drain conductive bus lines (CD0, CD1) are formed alternately and transversely to the plurality of STI regions, wherein each of the plurality of common-source/drain conductive bus lines (CS0/CD0, CS1/CD1) is formed over a first/second flat bed between a pair of first sidewall dielectric spacers 315a and the first/second flat bed is alternately formed by a heavily-doped source/drain diffusion region 308b/309b (see FIG. 2B(c)) of a second conductivity type formed within a common-source/drain diffusion 308a/309a (see FIG. 2B(c)) of the second or first conductivity type and an etched first raised field-oxide layer, and each of the plurality of common-source/drain conductive bus lines (CS0/CD0, CS1/CD1) is integrated with the source/drain-sidewall conductive electrodes 313c (see FIG. 2B(c)); a plurality of stack-gate non-volatile memory devices with a tapered floating-gate structure 302b are alternately formed on the plurality of active regions and between each of the plurality of common-source conductive bus lines and its nearby common-drain conductive bus lines; a first interconnect-metal layer 321a (see FIG. 2B(c)) being integrated with a plurality of control-gate conductive islands 320b/306b (see FIG. 2B(c)) are simultaneously patterned and etched to form a word line (WL) by using a masking dielectric layer 322a being aligned to each of the plurality of active regions and two sidewall dielectric spacers 323a being formed over each sidewall of the masking dielectric layer 322a, and a plurality of word lines (WL0~WL2) are formed alternately and transversely to the plurality of common-source/drain conducive bus lines (CS0/CD0, CS1/CD1). As shown in FIG. 2A(c), the unit cell size as marked by a dash square is 4F². The cross-sectional view along the A–A' line as shown in FIG. 2A(c) is shown in FIG. 2B(c) and the cross-sectional views along the B–B' line, the C–C' line, and the D–D' line are separately shown in FIG. 7A through FIG. 7C.

Referring now to FIG. 2B(a) through FIG. 2B(c), there are shown the cross-sectional views along the A–A' line shown in FIG. 2A(a) through FIG. 2A(c), respectively, in which a pair of stack-gate non-volatile memory devices having a taped floating-gate structure are formed. FIG. 2B(a) shows a cross-sectional view along the A–A' line shown in FIG. 2A(a) for a contactless NOR-type memory array, in which each of the pair of stack-gate non-volatile memory devices comprises from top to bottom a second masking dielectric layer 307a, an elongated control-gate layer 306a, an intergate-dielectric layer 305a, a tapered floating-gate layer 302b, and a first gate-dielectric layer 301b; a first sidewall dielectric layer 311a being formed over each sidewall of the tapered floating-gate layers 302b and a second sidewall dielectric layer 312a being formed over each sidewall of the elongated control-gate layers 306a; a first sidewall dielectric spacer 315a being formed over each sidewall formed by the second masking dielectric layer 307a and the second sidewall dielectric layer 312a and on a dielectric layer 314b, and a source/drain-sidewall conductive electrode 313c is formed under the dielectric layer 314b and above a second gate-dielectric layer 310b. As shown in FIG. 2B(a), a common-source conductive bus line including a second metal-silicide layer 317b formed over a heavily-doped polycrystalline layer 316b integrated with the source-sidewall conductive electrodes 313c is formed over a first flat bed being alternately formed by a heavily-doped source diffusion region 308b of a second conductivity type formed within a common-source diffusion region 308a of the second conductivity type and an etched first raised field-oxide layer 304d (see FIG. 5A); a planarized thick-oxide layer 318a is formed over each of the common-source conductive bus lines 317b/316b; a planarized common-drain conductive island 319b/316d (not shown) including a planarized heavily-doped polycrystalline-silicon island 316d capped with a second metal-silicide layer 319b and integrated with the drain-sidewall conductive electrodes 313c is formed over a second flat bed being alternately formed by a heavily-doped drain diffusion region 309b of the second conductivity type formed within a common-drain diffusion region 309a of the first/second conductivity type and the etched first raised field-oxide layer 304d; a first interconnect-metal layer 321a integrated with the planarized common-drain conductive islands 319b/316d are simultaneously patterned and etched by using a masking dielectric layer 322a being aligned to each of the plurality of active regions and two sidewall dielectric spacers 323a being formed over each sidewall of the masking dielectric layer 322a. It is clearly seen that each of the stack-gate non-volatile memory devices can be programmed by either Fowler-Nordheim tunneling of electrons from the source-sidewall conductive electrode to the tapered floating-gate layer 302b or channel hot-electron injection with a longer effective channel length to alleviate the punch-through effect and can be erased from the tapered floating-gate layer 302b to the source-sidewall conductive electrode and/or the drain-sidewall conductive electrode.

FIG. 2B(b) shows a cross-sectional view along the A–A' line shown in FIG. 2A(b) for a contactless NAND-type memory array. It is clearly seen that the stack-gate structure is the same as that shown in FIG. 2B(a). However, the self-registered common-source/drain conductive island including a self-registered heavily-doped polycrystalline-silicon island 316c silicided with a first metal-silicide layer 317a is formed between a pair of first sidewall dielectric spacers 315a and nearby second raised field-oxide layers 304c (see FIG. 6A). A plurality of common-source conductive bus lines (not shown) are formed over the common-source diffusion regions 308b/308a of the source select transistors and a first interconnect-metal layer 321a integrated with the planarized common-drain conductive islands (not shown) of the drain select transistors are simultaneously patterned and etched to form a bit line by using a masking dielectric layer 322a being aligned to each of the plurality of active regions and two sidewall dielectric spacers 323a (see FIG. 6A) being formed over each sidewall of the masking dielectric layer 322a. It is clearly seen that the tapered floating-gate structure 302b offers a larger effective surface area for programming and erasing, and the self-registered common-source/drain conductive islands 317a/316c may largely reduce the interconnection series resistance of the common-source/drain diffusion regions 308a/308b of the second conductivity type.

FIG. 2B(c) shows a cross-sectional view along the A–A' line shown in FIG. 2A(c) for a contactless parallel common-source/drain conductive bit-lines memory array. It is also clearly seen that the stack-gate structure is the same as that shown in FIG. 2B(a). However, a plurality of common-source conductive bus lines 317b/316b and a plurality of common-drain conductive bus lines 317b/316b are formed alternately and transversely to the plurality of STI regions and a first interconnect-metal layer 321a integrated with the control-gate conductive islands 320b/306b are simultaneously patterned and etched to form a word line by using a masking dielectric layer 322a being aligned to each of the plurality of active regions and two sidewall dielectric spacers 323a being formed over each sidewall of the masking dielectric layer 322a. Similarly, each of the plurality of common-source conductive bus lines 317b/316b is formed over a first flat bed being alternately formed by a heavily-doped source diffusion region 308b of a second conductivity type formed within a common-source diffusion region 308a of the second conductivity type and an etched first raised field-oxide layer 304d (see FIG. 7A); each of the plurality of common-drain conductive bus line 317b/316b is formed over a second flat bed being alternately formed by a heavily-doped drain diffusion region 309b of the second conductivity type formed within a common-drain diffusion region 309a of the first or second conductivity type and an etched first raised field-oxide layer 304d. Similarly, each of the stack-gate non-volatile memory devices can be programmed by either Fowler-Nordheim tunneling of electrons from the source-sidewall conductive electrode 313c to the tapered floating-gate structure 302b or channel hot-electron injection with a longer effective channel length to alleviate the punch-through effect and can be erased from the tapered floating-gate structure 302b to the source-sidewall conductive electrode 313c and/or the drain-side conductive electrode 313c.

Accordingly, the features and advantages of a stack-gate non-volatile memory device and its contactless memory arrays of the present invention are summarized below:

(a) The stack-gate non-volatile memory device having a tapered floating-gate structure offers a cell size of $4F^2$ for three contactless memory arrays.

(b) The stack-gate non-volatile memory device having a tapered floating-gate structure offers a longer effective channel length for programming using channel hot-electron injection to alleviate the punch-through effect and a larger surface area for erasing stored electrons from the tapered floating-gate structure to the source/drain-sidewall conductive electrode using Fowler-Nordheim tunneling.

(c) The stack-gate non-volatile semiconductor device having a tapered floating-gate structure offers a larger surface area for programming using Fowler-Nordheim tunneling from the source-sidewall conductive electrode to the tapered floating-gate structure and for erasing stored electrons from the tapered floating-gate structure to the source-sidewall conductive electrode and/or the drain-sidewall conductive electrode.

(d) The contactless NOR-type memory array offers a highly conductive common-source conductive bus line with lower bus-line resistance and lower bus-line capacitance with respect to the semiconductor substrate and a highly conductive bit-line being integrated with the planarized common-drain conductive islands to form a contactless structure.

(e) The contactless NAND-type memory array offers a self-registered common-source/drain conductive island to reduce the internal series resistance for the stack-gate non-volatile memory devices.

(f) The contactless parallel common-source/drain conductive bit-lines array offers a highly conductive common-source/drain conductive bit-line with lower bit-line resistance and lower bit-line capacitance with respect to the semiconductor substrate and a highly conductive word line being integrated with the control-gate conductive islands to form a contactless structure.

Figure 3A:
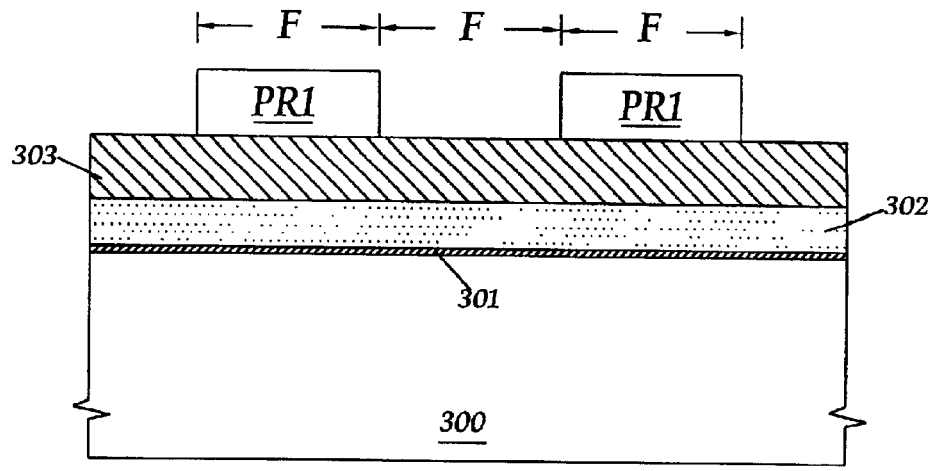
FIG. 3A through FIG. 3F show the process steps and their cross-sectional views of fabricating a shallow-trench-isolation structure for forming a stack-gate non-volatile semiconductor memory device and its contactless memory arrays.

Referring now to FIG. 3A through FIG. 3F, there are shown the process steps and their cross-sectional views of fabricating a shallow-trench-isolation (STI) structure for forming a stack-gate non-volatile memory device and its contactless memory arrays of the present invention. As shown in FIG. 3A, a first gate-dielectric layer 301 is formed over a semiconductor substrate 300 of a first conductivity type; a first conductive layer 302 is formed over the first gate-dielectric layer; a first masking dielectric layer 303 is formed over the first conductive layer 302, and a plurality of masking photoresist PR1 are formed over the first masking dielectric layer 303 to define a plurality of shallow-trench-isolation (STI) regions (STI lines) (between PR1) and a plurality of active regions (AA's) (under PR1). The first gate-dielectric layer 301 is preferably a thermal-oxide layer or a nitrided thermal-oxide layer having a thickness between 80 Angstroms and 120 Angstroms. The first conductive layer 302 is preferably a doped polycrystalline-silicon layer or a doped amorphous-silicon layer as deposited by low-pressure chemical-vapor-deposition (LPCVD) and its thickness is preferably between 500 Angstroms and 3000 Angstroms. The first masking dielectric layer 303 is preferably a silicon-nitride layer as deposited by LPCVD and its thickness is preferably between 300 Angstroms and 3000 Angstroms. It should be noted that the width and the space of the plurality of masking photoresist PR1 can be defined to be a minimum-feature-size (F) of technology used, as shown in FIG. 3A.

Figure 3B:
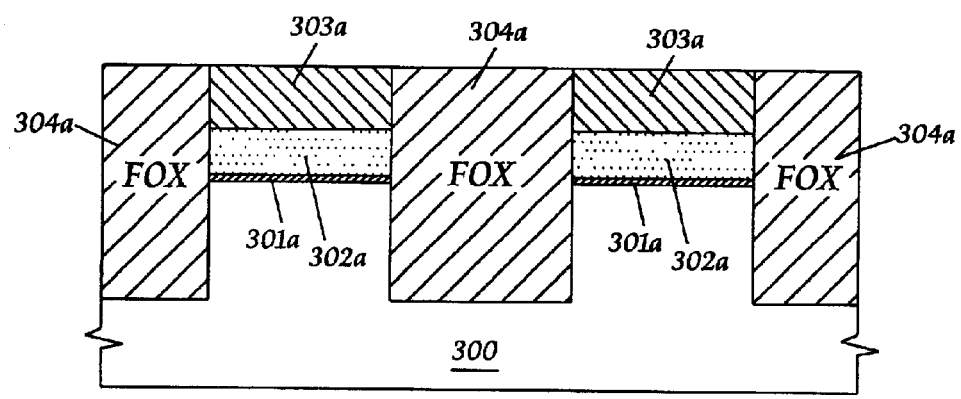

FIG. 3B shows that the first masking dielectric layer 303, the first conductive layer 302, and the first gate-dielectric layer 301 outside of the plurality of masking photoresist PR1 are sequentially removed by using anisotropic dry etching; the semiconductor substrate 300 is then etched to form the shallow trenches; subsequently, the plurality of masking photoresist PR1 are stripped; and thereafter, a planarized field-oxide layer 304a (FOX) is formed to fill up each of the shallow trenches. The depth of the shallow trenches is preferably between 3000 Angstroms and 10000 Angstroms. The planarized field-oxide layer 304a is preferably made of silicon-oxide or phosphosilicate-glass (P-glass) as deposited by high-density plasma (HDP) CVD or CVD and is formed by first depositing a thick-oxide film to fill up the gaps and then planarizing the deposited thick-oxide film using chemical-mechanical polishing (CMP) with the first masking dielectric layer 303a as a polishing stop.

Figure 3C:
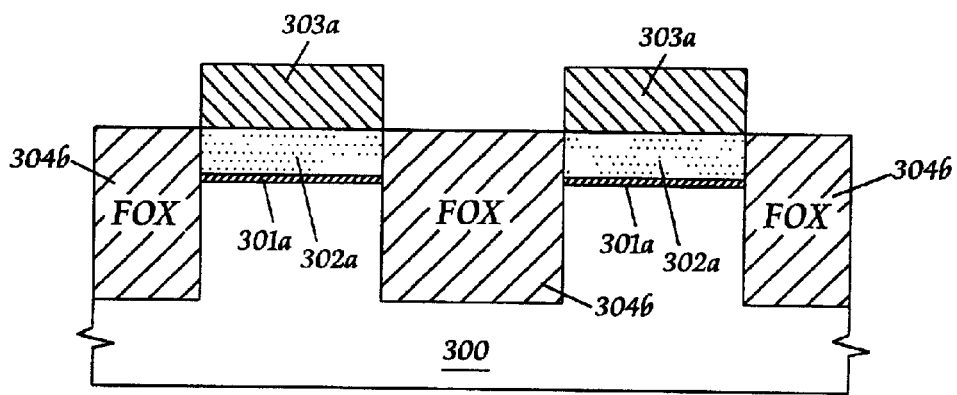

FIG. 3C shows that the planarized field-oxide layers 304a are etched back to a thickness of the first masking dielectric layer 303a to form a first raised field-oxide layer 304b in each of the shallow trenches.

Figure 3D:
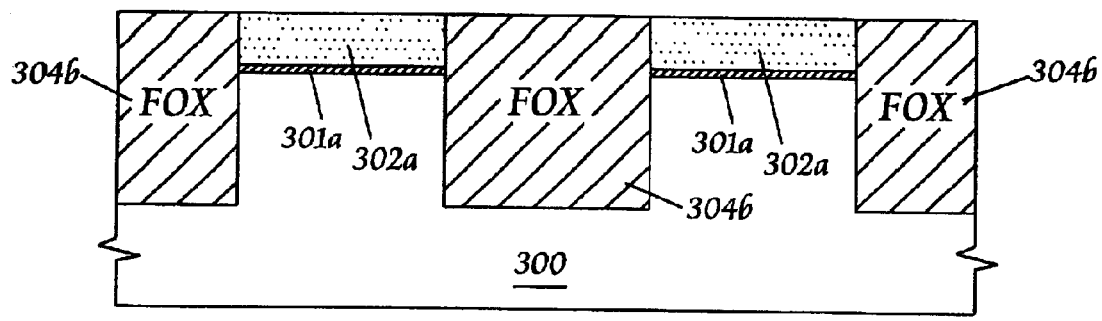

FIG. 3D shows that the first masking dielectric layers 303a are selectively removed by using hot-phosphoric acid or anisotropic dry etching. It is clearly seen that the surface is made to be flat for fine-line lithography later on.

Figure 3E:
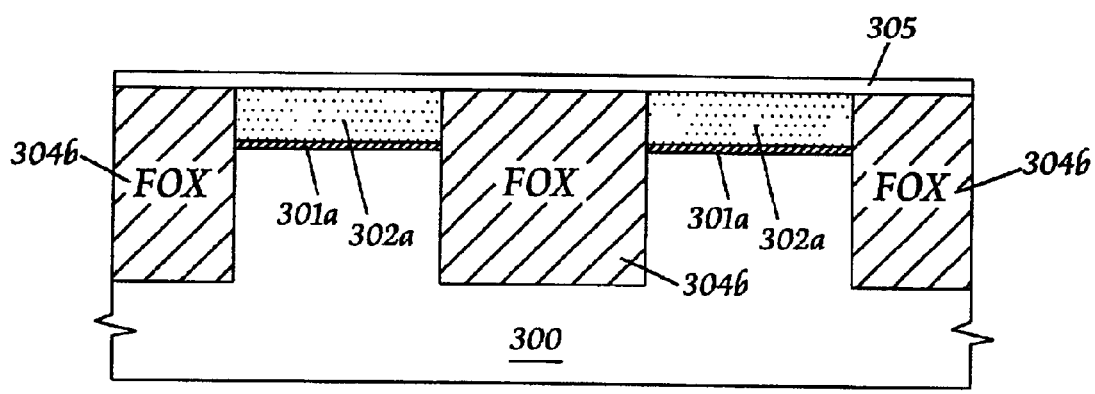

FIG. 3E shows that a first intergate-dielectric layer 305 is formed over the flat surface as shown in FIG. 3D. The first intergate-dielectric layer 305 is preferably an oxide-nitride-oxide (ONO) structure or a nitride-oxide structure having an equivalent oxide thickness between 80 Angstroms and 150 Angstroms and can be a silicon-oxide layer as deposited by high-temperature-oxide (HTO) deposition or thermal-oxidation having a thickness between 100 Angstroms and 200 Angstroms.

Figure 3F:
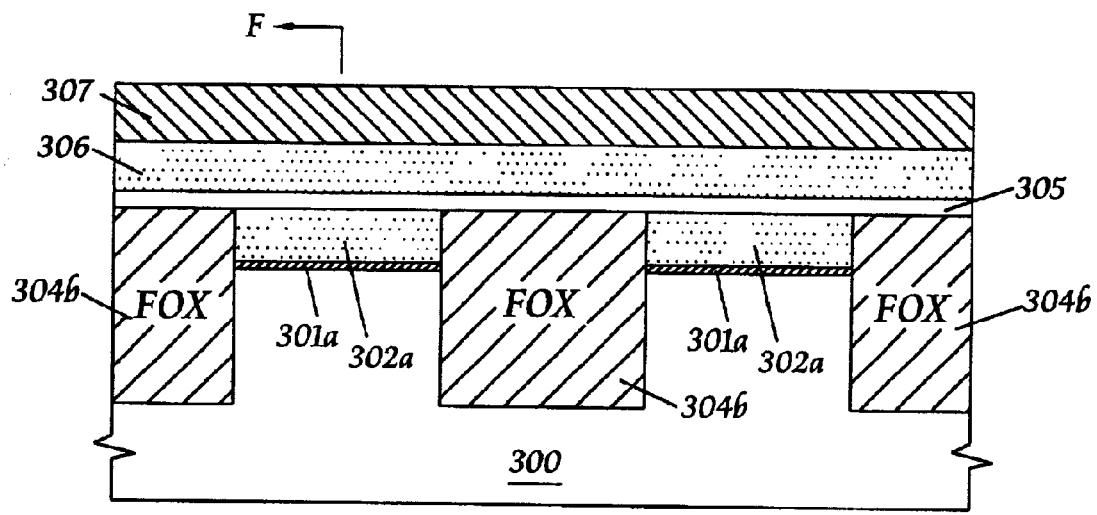
Figure 4A:
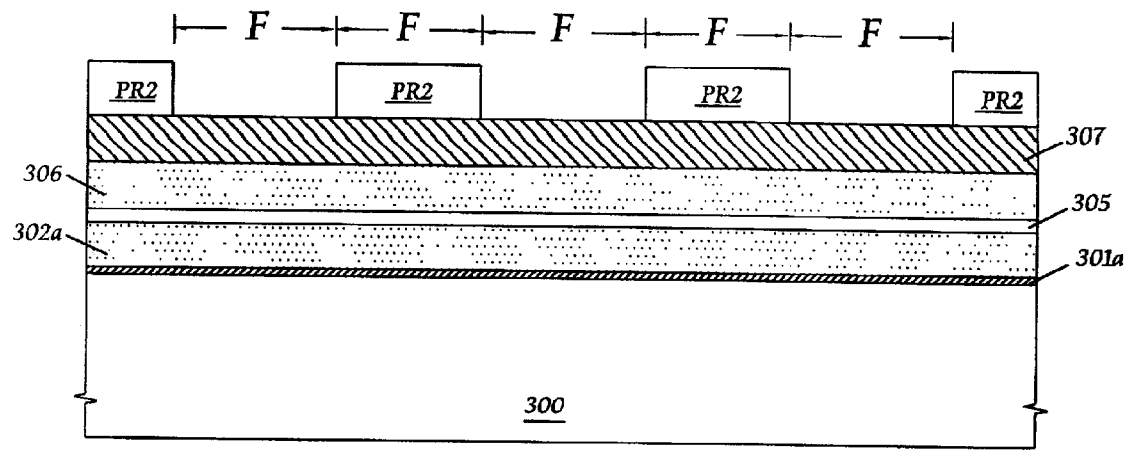
FIG. 4A through FIG. 4H show the process steps and their cross-sectional views of fabricating a stack-gate non-volatile semiconductor memory device and its contactless memory arrays.

FIG. 3F shows that a second conductive layer 306 is formed over the first intergate-dielectric layer 305 and a second masking dielectric layer 307 is formed over the second conducive layer 306. The second conductive layer 306 is preferably a doped polycrystalline-silicon layer as deposited by LPCVD or a doped polycrystalline-silicon layer capped with a tungsten-silicide (WSi$_2$) layer and its thickness is preferably between 1500 Angstroms and 4000 Angstroms. The second masking dielectric layer 307 is preferably a silicon-nitride layer, an oxynitride layer, or a composite dielectric layer such as a silicon-nitride layer over a silicon-oxide layer and its thickness is preferably between 2000 Angstroms and 5000 Angstroms. The cross-sectional view along each of the plurality of active regions as marked by the F–F' line is shown in FIG. 4A. It should be emphasized that the STI structure shown in FIG. 3F is only an example but isn't exclusive.

Referring now to FIG. 4A through FIG. 4H, there are shown the process steps and their cross-sectional views for fabricating a stack-gate non-volatile memory device and its contactless memory arrays of the present invention. FIG. 4A shows that a plurality of masking photoresist PR2 are formed over a stack-layer structure to define a plurality of stack-gate regions (under PR2) and a plurality of common-source/drain regions (between PR2) being transversely to the plurality of STI regions. The width and the space of the plurality of masking photoresist PR2 can be defined to be a minimum-feature-size (F) of technology used.

Figure 4B:
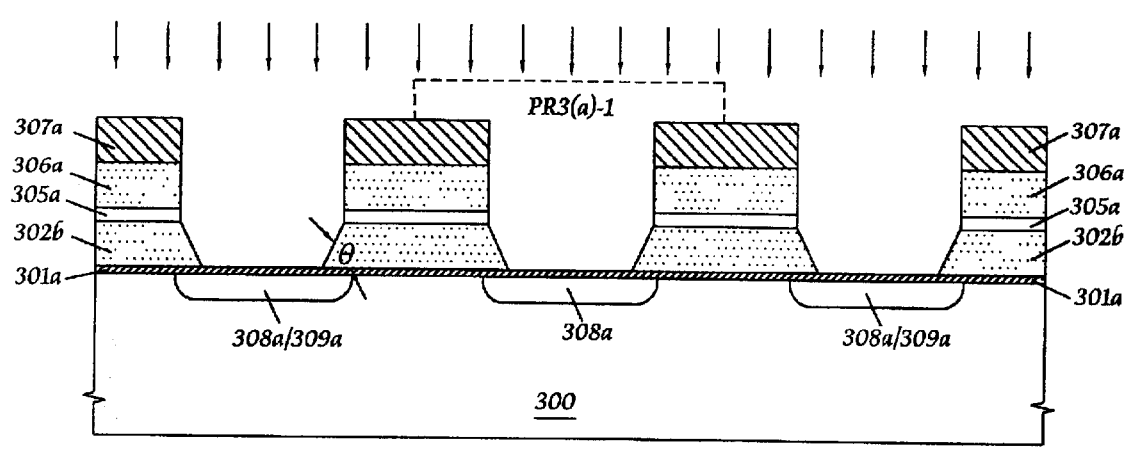

FIG. 4B shows that the second masking dielectric layer 307, the second conductive layer 306, the first intergate-dielectric layer 305 outside of the plurality of masking photoresist PR2 are sequentially removed by using anisotropic dry etching and the first conductive layer 302a is anisotropically etched to form a tapered floating-gate structure by using a well-known art; and subsequently, the plurality of masking photoresist PR2 are stripped. The taper angle as marked by θ in FIG. 4B is preferably between 45 degrees and 90 degrees. FIG. 4B also shows that the common-source/drain diffusion regions 308a, 309a can be formed by a self-aligned implantation of doping impurities across the tapered floating-gate structure and the first gate-dielectric layer 301a and different doping types can be performed with or without the masking photoresist steps. For examples, the common-source/drain diffusion regions 308a of a second conductivity type can be implanted without a masking photoresist step; the common-drain diffusion regions 309a of a first conductivity type are formed by a masking photoresist step PR3(a)-1 and the common-source diffusion regions 308a of a second conductivity type are formed by another masking photoresist step PR3(b)-1 (not shown). It should be emphasized that the doping profile being formed will be graded due to the tapered floating-gate structure.

Figure 4C:
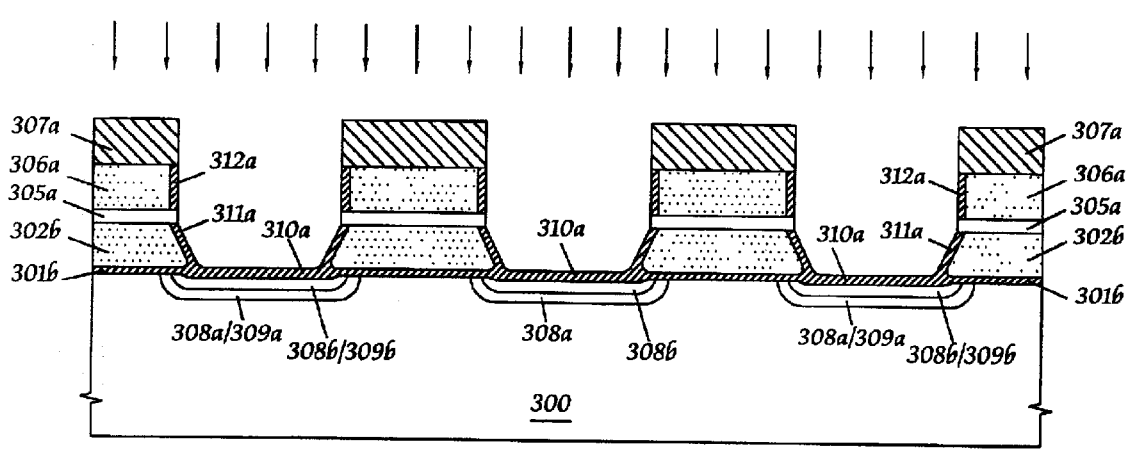

FIG. 4C shows that the first gate-dielectric layers 301a between the tapered floating-gate structure are removed first by dipping in a dilute hydrofluoric acid or using anisotropic dry etching and the first raised field-oxide layers 304b are slightly etched simultaneously to form second raised field-oxide layers 304c; a thermal-oxidation process is performed to form a first sidewall dielectric layer 311a over each sidewall of the tapered floating-gate layers, a second sidewall dielectric layer 312a over each sidewall of the second conductive layers 306a, and a second gate-dielectric layer 310a over the semiconductor substrate; and the shallow heavily-doped source/drain diffusion regions 308b, 309b of a second conductivity type are formed in a self-aligned manner by implanting doping impurities across the second gate-dielectric layers 310a and the oxidized tapered floating-gate layers 302b. The first/second sidewall dielectric layer 311a/312a is preferably a thermal poly-oxide layer or a nitrided thermal poly-oxide layer having a thickness between 100 Angstroms and 200 Angstroms and a second gate-dielectric layer 310a is preferably a thermal-oxide layer or a nitrided thermal-oxide layer having a thickness between 80 Angstroms and 150 Angstroms.

Figure 4D:
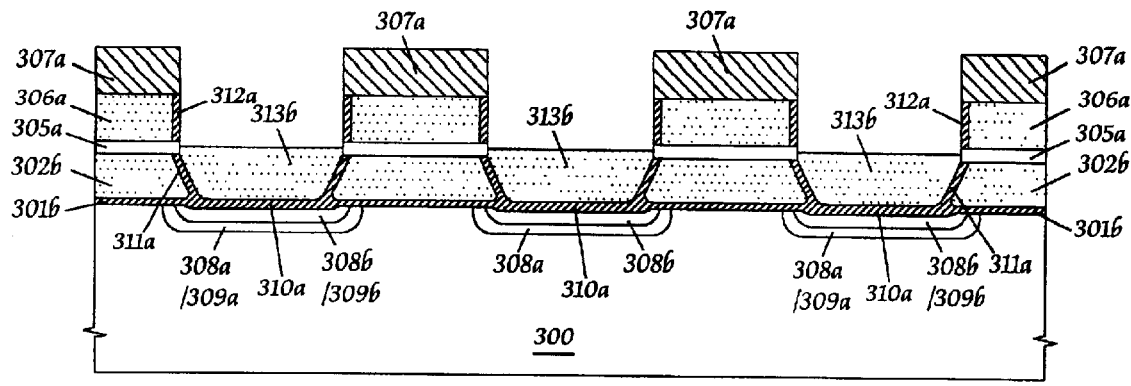

FIG. 4D shows that planarized third conductive layers 313a are formed over the gaps between the second masking dielectric layers 307a and are then etched back to a depth approximately equal to or slightly smaller than the surface level of the second raised field-oxide layers 304c between the second masking dielectric layers 307a to form the common conductive electrodes 313b. The planarized third conductive layer 313a is preferably made of doped polycrystalline or amorphous-silicon and is formed by first depositing a thick third conductive film 313 to fill up the gaps between the second masking dielectric layers 307a and then planarizing the deposited third conductive film using CMP with the second masking dielectric layer 307a as a polishing stop.

Figure 4E:
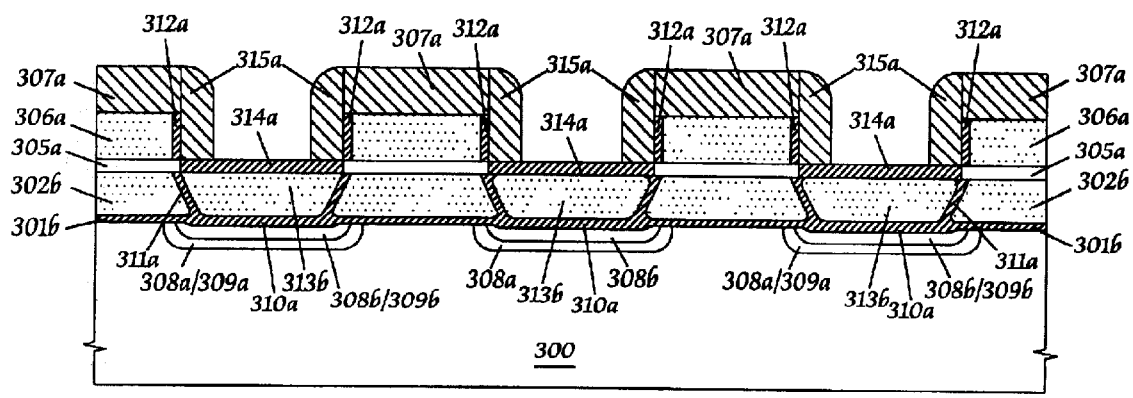

FIG. 4E shows that a thermal-oxidation process is performed to form a thin poly-oxide layer 314a over the common conductive electrodes 313b to remove the possible conductive material over the second raised field-oxide layers 304c; a first sidewall dielectric spacer 315a is formed over each sidewall of the stack-gate regions and on the thin poly-oxide layer 314a. The first sidewall dielectric spacer 315a is preferably made of silicon-nitrides as deposited by LPCVD and is formed by first depositing a conformable dielectric layer 315 over the formed structure and then etching back the thickness of the deposited conformable dielectric layer 315.

Figure 4F:
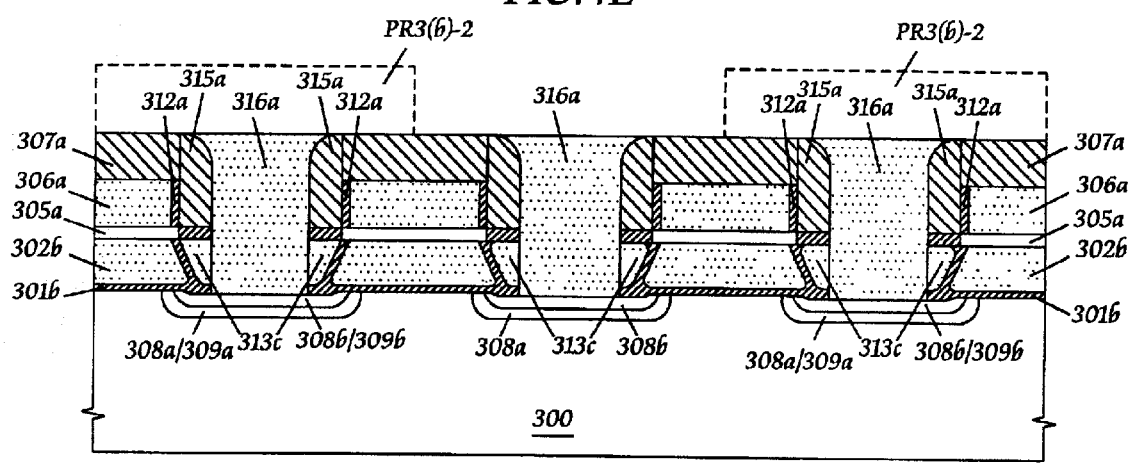

FIG. 4F shows that the second raised field-oxide layers 304c outside of the second masking dielectric layers 307a and the first sidewall dielectric spacers 315a are anisotropically etched back to a depth approximately equal to the top surface of the second gate-dielectric layers 310a and the thermal poly-oxide layers 314a are simultaneously removed; the common conductive electrodes 313b are then anisotropically removed; subsequently, the second gate-dielectric layers 310a are removed and the etched-back raised field-oxide layers are simultaneously etched to form a first/second flat bed between the first sidewall dielectric spacers 315a. The first/second flat bed is alternately formed by a shallow heavily-doped source/drain diffusion region 308b/309b and an etched first raised field-oxide layer 304d. It should be noted that for a NAND-type memory array, the third raised field-oxide layers 304e (see FIG. 6A) between the first sidewall dielectric spacers 315a are remained to form self-registered common-source/drain conductive islands 316c. FIG. 4F also shows that the planarized fourth conductive layers 316a are formed over the gaps between the first sidewall dielectric spacers 315a. The planarized fourth conductive layer 316a is preferably made of doped polycrystalline-silicon as deposited by LPCVD and is formed by first depositing a thick fourth conductive film 316 to fill up the gaps and then planarizing the deposited fourth conductive film 316 with the second masking dielectric layer 307a as a polishing stop.

Figure 4G:
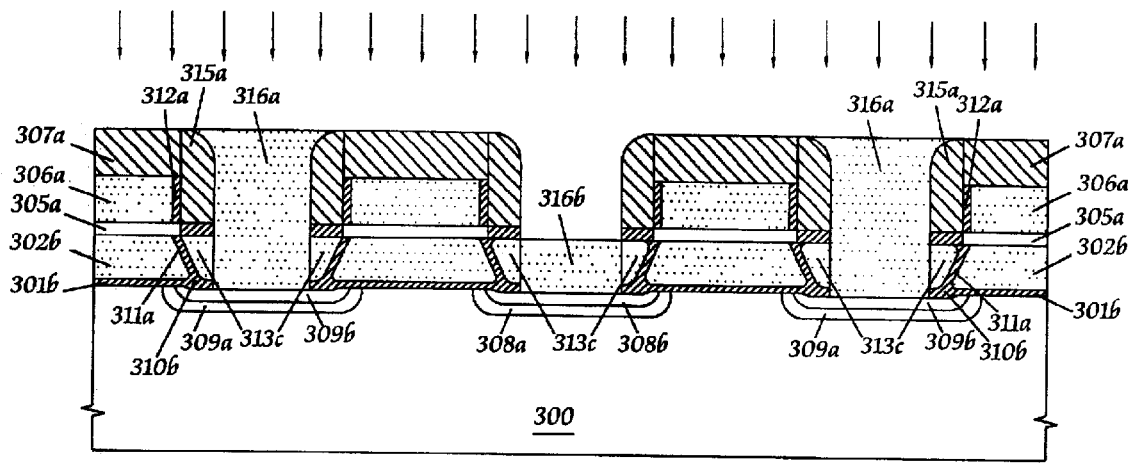
Figure 4G:
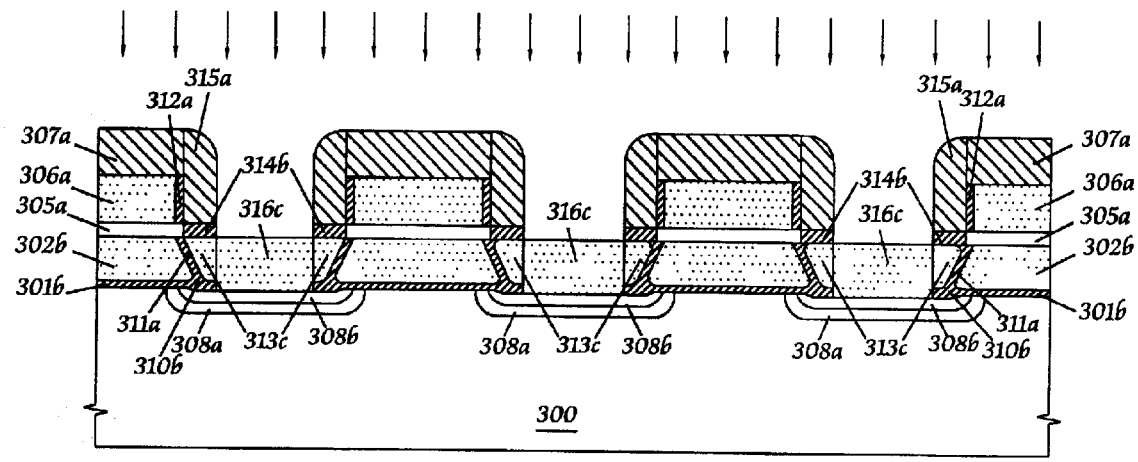
Figure 4G:
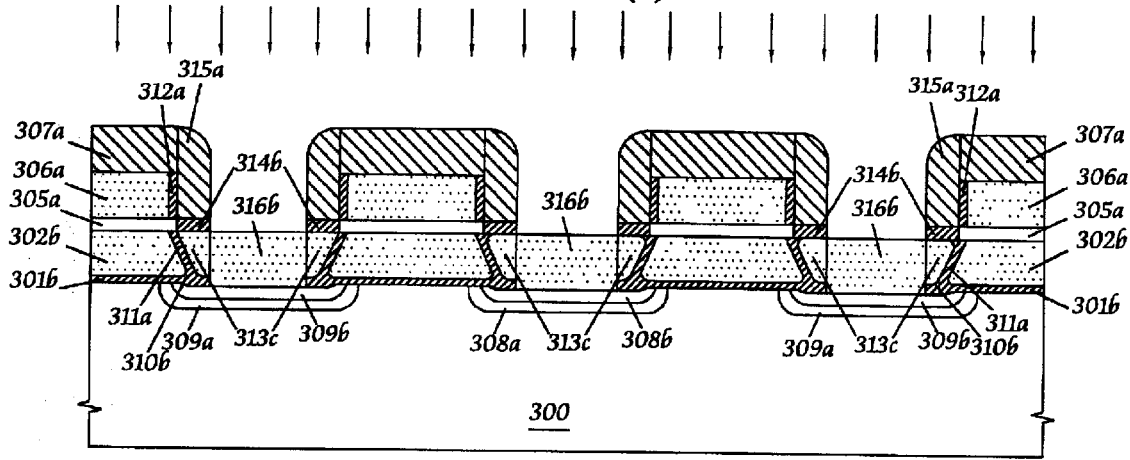

FIG. 4G(a) shows that the planarized fourth conductive layers 316a over the common-source regions are selectively etched back to a depth approximately equal to a top surface of the thermal poly-oxide layer 314b to form the common-source conductive bus lines 316b by using a masking photoresist step PR3(b)-2 as shown in FIG. 4F; the masking photoresist PR3(b)-2 are stripped; and subsequently, ion implantation is performed to heavily dope the common-source conductive bus lines 316b and the planarized fourth conducive layers 316a. It is clearly seen that FIG. 4G(a) is mainly formed for a NOR-type memory array.

FIG. 4G(b) shows that the planarized fourth conductive layers 316a are etched back to a depth approximately equal to or below the top surface of the third raised field-oxide layers 304e to form self-registered common-source/drain conductive islands 316c; and subsequently, ion implantation is performed to heavily dope the self-registered common-source/drain conductive islands 316c. It is clearly seen that FIG. 4G(b) is mainly formed for a NAND-type memory array.

FIG. 4G(c) shows that the planarized fourth conductive layers 316a are etched back to a depth approximately equal to a top surface of the thermal poly-oxide layer 314b to form the common-source/drain conductive bus lines 316b; and subsequently, ion implantation is performed to heavily dope the common-source/drain conductive bus lines 316b. It is clearly seen that FIG. 4G(c) is mainly formed for a parallel common-source/drain conductive bit-lines memory array.

Figure 4H:
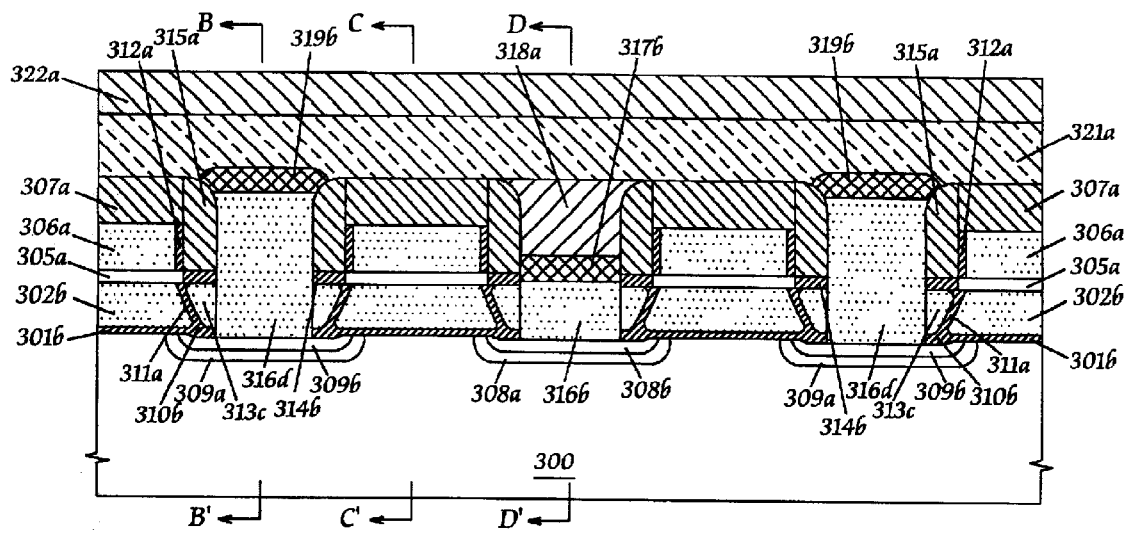
Figure 4H:
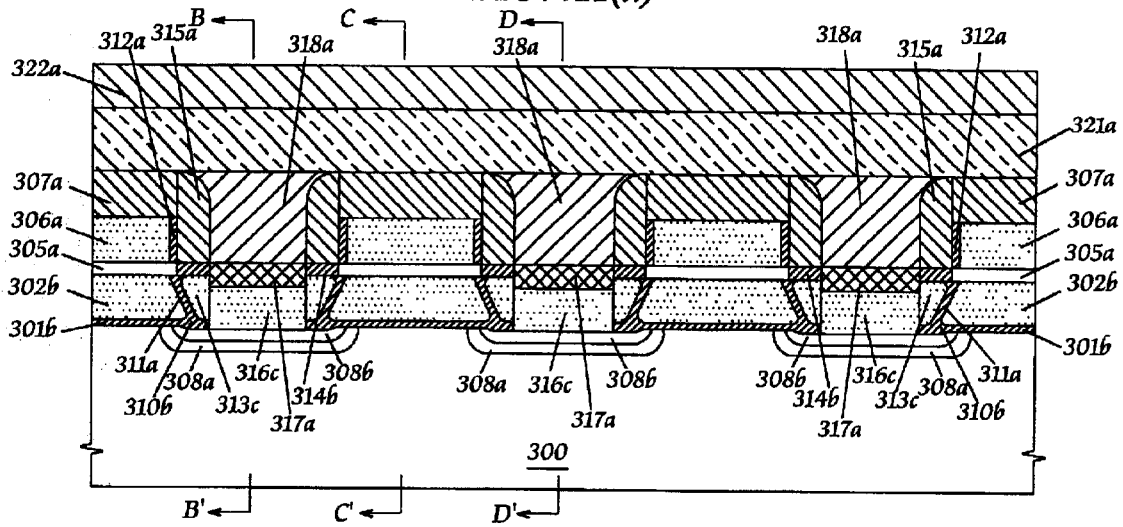
Figure 4H:
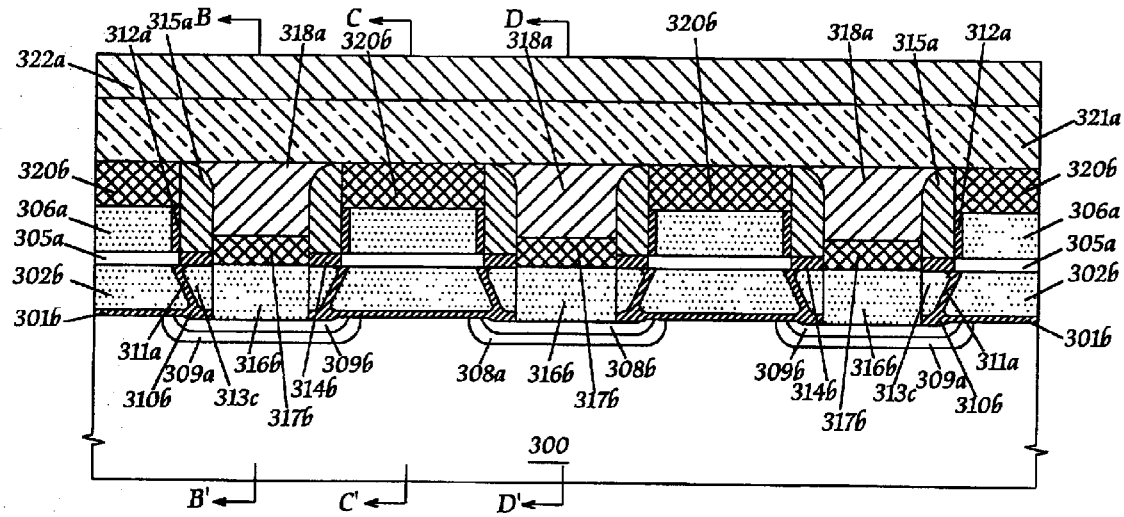

FIG. 4H(a) shows that a highly conductive layer 317b is formed over each of the common-source conductive bus lines 316b; a planarized thick-oxide layer 318a is formed over each of the highly conductive layers 317b; a self-aligned metal-silicide layer 319a is formed over each of the planarized common-drain conductive layers 316b; a first interconnect-metal layer 321a integrated with the planarized common-drain conductive islands 319b/316d is simultaneously patterned and etched by a masking dielectric layer 322a being aligned to each of the plurality of active regions and two sidewall dielectric spacers 323a being formed over each sidewall of the masking dielectric layer 322a to form a bit line 321a, and a plurality of bit lines 321a are formed transversely to a plurality of common-source conductive bus lines 317b/316b. The highly conductive layer 317b is preferably made of tungsten-silicide (WSi) or tungsten and is formed by first forming the planarized conductive layer 317a and then etching back. Similarly, the highly conductive layers 317b and the self-aligned metal-silicide layers 319b can be formed simultaneously by using a self-aligned silicidation process and the metal-silicide layer formed is preferably a refractory metal-silicide layer such as a titanium-silicide ($TiSi_2$) or cobalt-silicide ($CoSi_2$) layer. It should be noted that the second conductive layer 306a being acted as a word line is preferably a doped polycrystalline-silicon layer capped with a tungsten-silicide layer and the second masking dielectric layer 307a is preferably an oxynitride layer or a silicon-nitride layer capped on a silicon-oxide layer.

FIG. 4H(b) shows that a self-aligned silicidation process is performed to form a first metal-silicide layer 317a over each of self-registered common-source/drain conductive islands 316c and the planarized thick-oxide layers 318a are formed over the first metal-silicide layers 317a. A first interconnect-metal layer 321a integrated with the planarized common-drain conductive islands of the drain select-transistors (not shown) are simultaneously patterned and etched to form a bit line by using a masking dielectric layer 322a being aligned to each of the plurality of active regions and two sidewall dielectric spacers 323a being formed over each sidewall of the masking dielectric layer 322a and a plurality of bit lines 321a are formed transversely to a plurality of word lines (WL) being formed by the elongated control-gate conductive layers 306a. (Similarly, a plurality of common-source conductive bus lines (not shown) are formed alternately and transversely to the plurality of STI regions, wherein each of the plurality of common-source conductive bus lines is formed over a first flat bed being alternately formed by a heavily-doped source diffusion region of a second conductivity type formed within a common-source diffusion region of the second conductivity type of the source select-gate transistors and an etched first raised field-oxide layer. The elongated control-gate conductive layer 306a is preferably a doped polycrystalline-silicon layer capped with a tungsten-silicide layer and the second masking dielectric layer 307a is preferably an oxynitride layer or a silicon-nitride layer over a silicon-oxide layer. The first metal-silicide layer 317a is preferably a refractory metal-silicide layer such as a titanium-silicide ($TiSi_2$) or cobalt-silicide ($CoSi_2$) layer.

FIG. 4H(c) shows that a second metal-silicide layer 317b is formed over each of the common-source/drain conductive bus lines 316*b*; a planarized thick-oxide layer 318*a* is formed over each of the second metal-silicide layers 317*b*; the second masking dielectric layers 307*a* are selectively removed by anisotropic dry etching and the planarized conductive layers 320*a* are refilled again; a first interconnect-metal layer 321*a* integrated with the control-gate conductive islands 320*b*/306*b* are simultaneously patterned and etched to form a word line by using a masking dielectric layer 322*a* being aligned to each of the plurality of active regions and two sidewall dielectric spacers 323*a* being formed over each sidewall of the masking dielectric layer 322*a* and a plurality of word lines are formed alternately and transversely to the plurality of common-source/drain conductive bus lines 317*b*/316*b*. The second metal-silicide layer 317*b* is preferably made of refractory metal-silicides such as titanium-silicide or cobalt-silicide by using a well-known self-aligned silicidation process or is preferably a tungsten-silicide layer being formed by deposition/planarization/etching back. The planarized conductive layer 320*a* is preferably made of tungsten-silicides or tungsten.

Figure 5A:
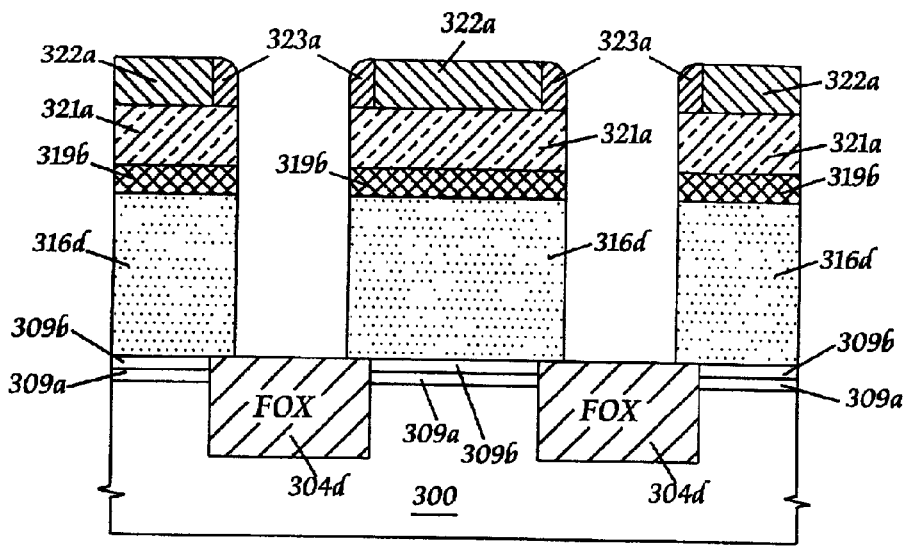
FIG. 5A through FIG. 5C show the cross-sectional views of a contactless NOR-type memory array shown in FIG. 2A(a) and FIG. 4H(a) along the B–B' line, the C–C' line, and the D–D' line, respectively.
Figure 5B:
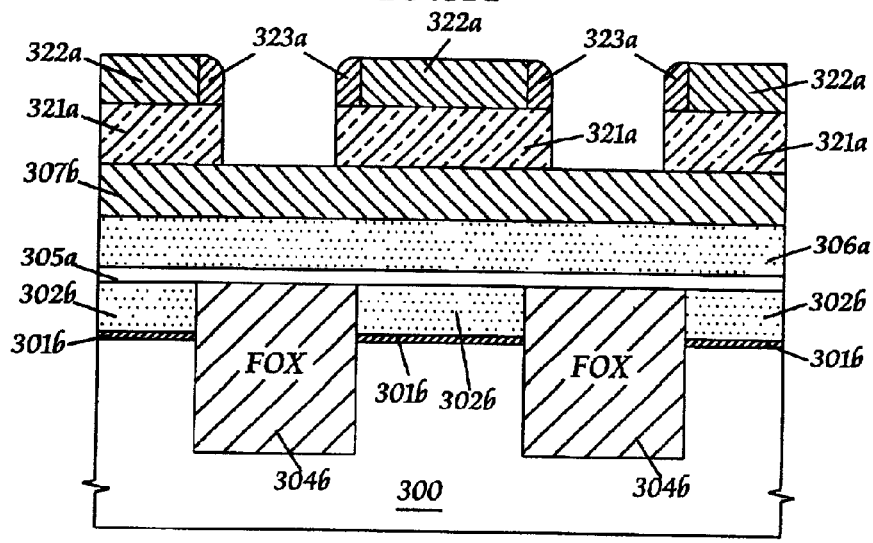
Figure 5C:
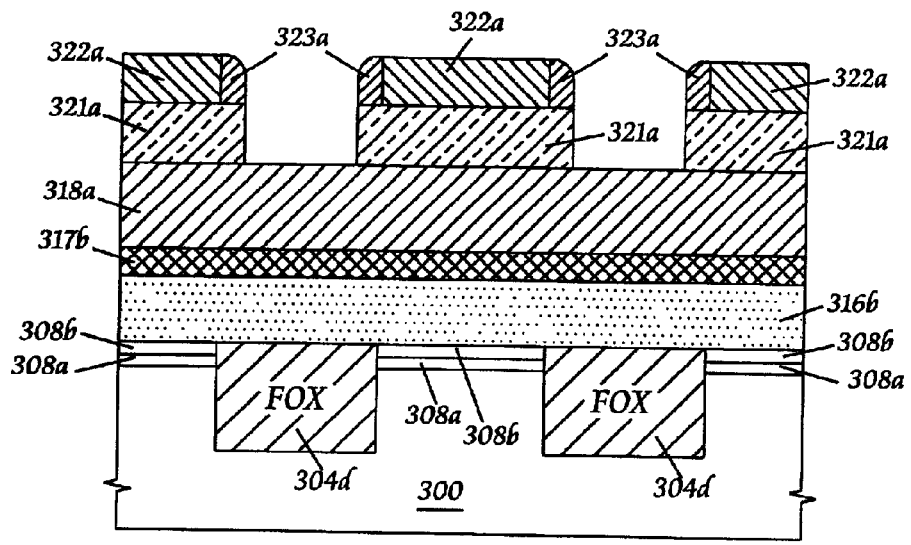

Referring now to FIG. 5A through FIG. 5C, there are shown various cross-sectional views along the B–B' line, the C–C' line, and the D–D' line shown in FIG. 2A(a) and FIG. 4H(a) for a contactless NOR-type memory array of the present invention. FIG. 5A shows a cross-sectional view along the planarized common-drain conductive islands as indicated by the B–B' line shown in FIG. 4H(a) and FIG. 2A(a), in which a plurality of bit lines 321*a* integrated with planarized common-drain conductive islands 319*b*/316*d* are formed over the second flat beds and are simultaneously patterned and etched by a plurality of hard masking dielectric layers, wherein each of the plurality of hard masking dielectric layers includes a masking dielectric layer 322*a* being aligned to each of the plurality of active regions and two sidewall dielectric spacers 323*a* being formed over each sidewall of the masking dielectric layer 322*a* to eliminate misalignment; the second flat bed is alternately formed by an etched first raised field-oxide layer 304*d* and a heavily-doped drain diffusion region 309*b* of a second conductivity type formed within a common-drain diffusion region 309*a* of a first or second conductivity type.

FIG. 5B shows a cross-sectional view along the stack-gate region as indicated by the C–C' line shown in FIG. 4H(a) and FIG. 2A(a), in which an elongated control-gate conductive layer 306*a* acting as a word line is capped with a second masking dielectric layer 307*b* and is formed over a first intergate-dielectric layer 305*a*; the intergate-dielectric layer 305*a* is formed over a flat surface being alternately formed by a first raised field-oxide layer 304*b* and a tapered floating-gate layer 302*b* over a first gate-dielectric layer 301*b*; and a plurality of bit lines 321*a* are patterned and etched by the plurality of hard masking dielectric layers as described.

FIG. 5C shows a cross-sectional view along a common-source conductive bus line as indicated by the D–D' line shown in FIG. 4H(a) and FIG. 2A(a), in which the common-source conductive bus line 317*b*/316*b* is formed over a first flat bed being alternately formed by an etched first raised field-oxide layer 304*d* and a heavily-doped source diffusion region 308*b* of a second conductivity type formed within a common-source diffusion region 308*a* of the second conductivity type; a planarized thick-oxide layer 318*a* is formed over each of the common-source conductive bus lines 317*b*/316*b*; and a plurality of bit lines 321*a* being patterned and etched by the plurality of hard masking dielectric layers as described.

Figure 6A:
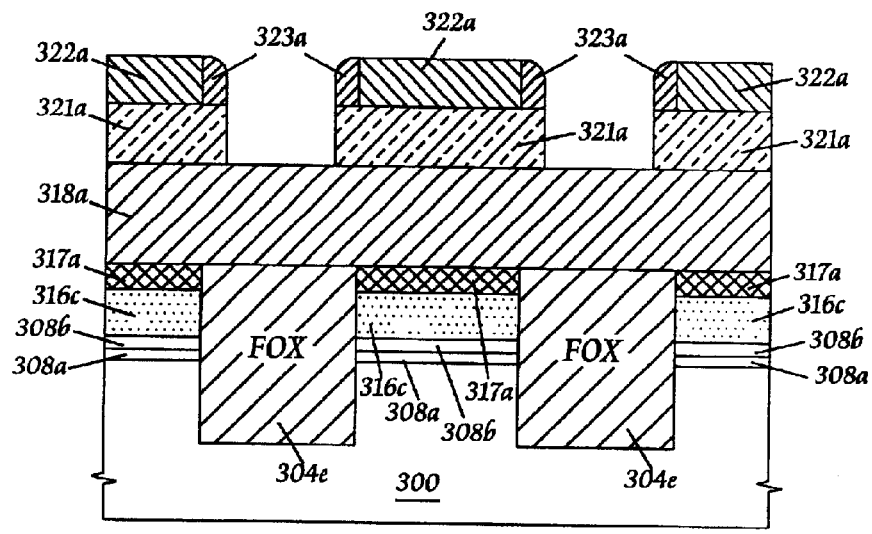
FIG. 6A through FIG. 6C show the cross-sectional views of a contactless NAND-type memory array shown in FIG. 2A(b) and FIG. 4H(b) along the B–B' line, the C–C' line, and the D–D' line, respectively.
Figure 6B:
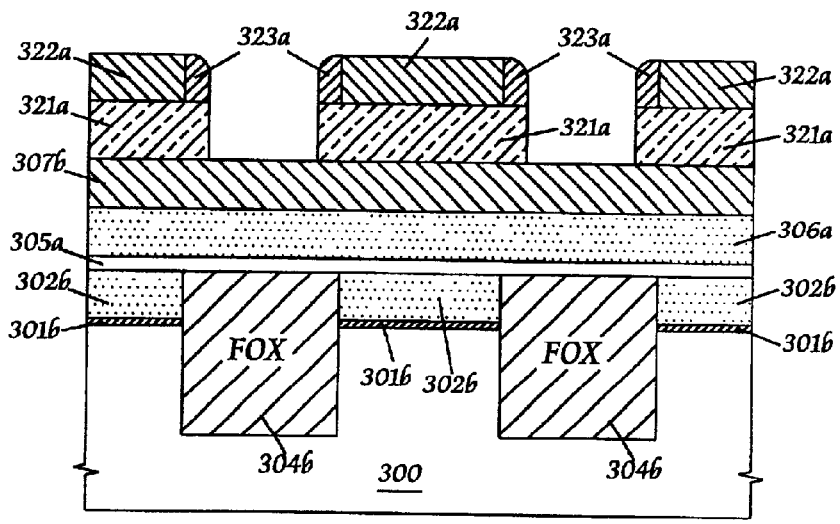
Figure 6C:
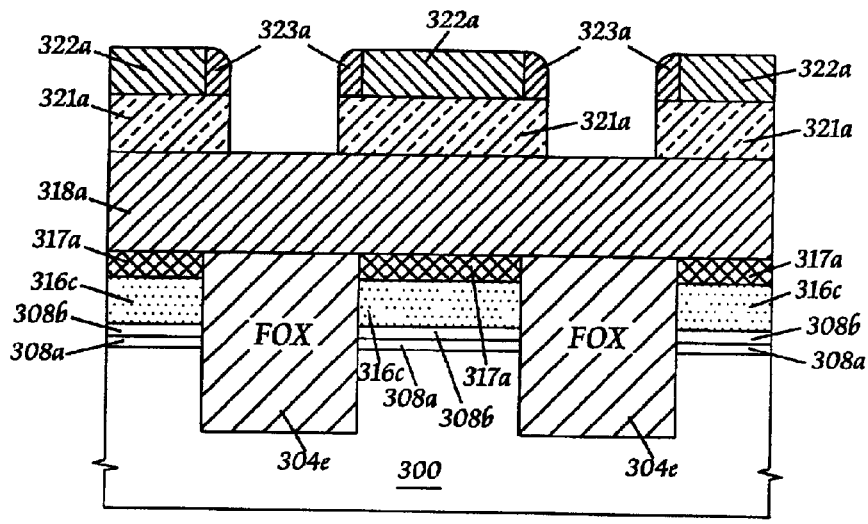

Referring now to FIG. 6A through FIG. 6C, there are shown various cross-sectional views along the B–B' line, the C–C' line, and the D–D' line shown in FIG. 2A(b) and FIG. 4H(b) for a contactless NAND-type memory array of the present invention. FIG. 6A shows a cross-sectional view along the common-source/drain region as indicated by the B–B' line shown in FIG. 4H(b) and FIG. 2A(b), in which each of the self-registered common-source/drain conductive islands 317*a*/316*c* is formed between the third raised field-oxide layers 304*e* and on a heavily-doped source/drain diffusion region 308*b* of a second conductivity type formed within a common-source/drain diffusion 308*a* of the second conductivity type; a planarized thick-oxide layer 318*a* is formed over the common-source/drain conductive islands 317*a*/316*c* and the third raised field-oxide layers 304*e*; a plurality of bit lines 321*a* are patterned and etched by a plurality of hard masking dielectric layers, wherein each of the plurality of hard masking dielectric layers includes a masking dielectric layer 322*a* being aligned to each of the plurality of active regions and two sidewall dielectric spacers 323*a* being formed over each sidewall of the masking dielectric layer 322*a*.

FIG. 6B shows a cross-sectional view along the stack-gate region as indicated by the C–C' line shown in FIG. 4H(b) and FIG. 2A(b). It is clearly seen that FIG. 6B is the same as that shown in FIG. 5B and further discussions are ignored.

FIG. 6C shows a cross-sectional view along the common-source/drain region as indicated by the D–D' line shown in FIG. 4H(b) and FIG. 2A(b). Due to the symmetrical nature of the common-source/drain regions, FIG. 6C is the same as that shown in FIG. 6A.

Figure 7A:
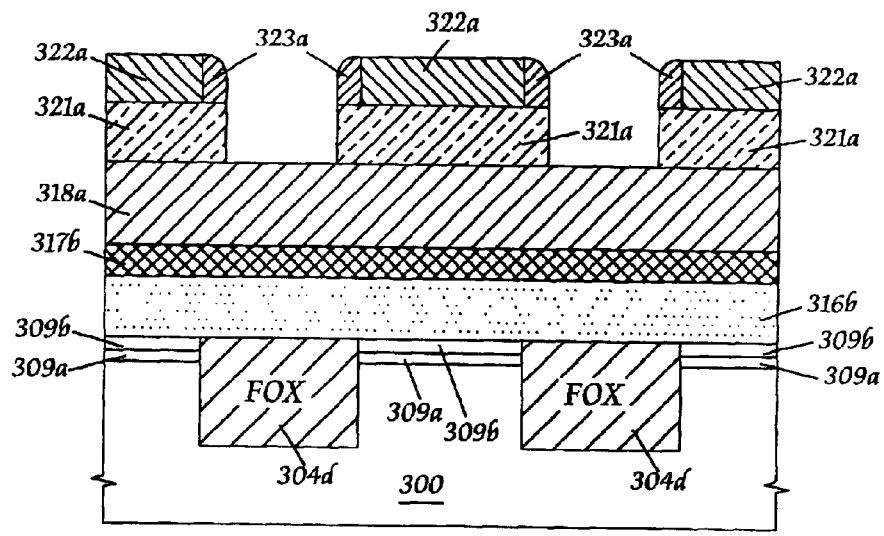
FIG. 7A through FIG. 7C show the cross-sectional views of a contactless parallel common-source/drain conductive bit-lines memory array shown in FIG. 2A(c) and FIG. 4H(c) along the B–B' the C–C' line, and the D–D' line, respectively.
Figure 7B:
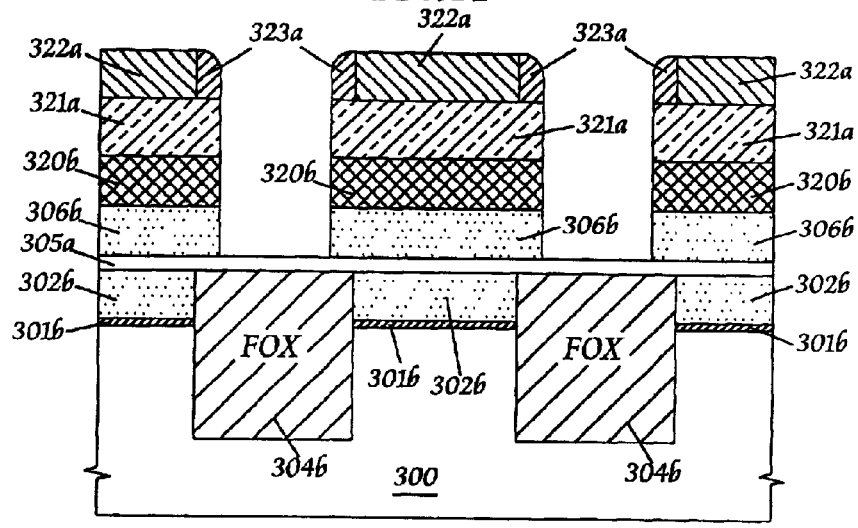
Figure 7C:
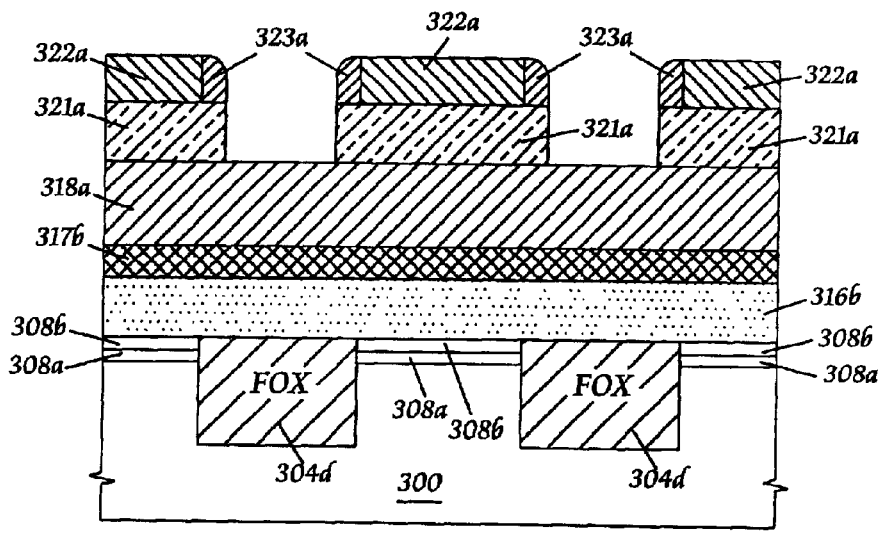

Referring now to FIG. 7A through FIG. 7C, there are shown various cross-sectional views along the B–B' line, the C–C' line, and the D–D' line shown in FIG. 2A(c) and FIG. 4H(c) for a contactless parallel source/drain conductive bit-lines memory array of the present invention. FIG. 7A shows a cross-sectional view along the common-drain conductive bus line as indicated by the B–B' line shown in FIG. 4H(c) and FIG. 2A(c), in which the common-drain conductive bus line 317*b*/316*b* is formed over a second flat bed being alternately formed by an etched first raised field-oxide layer 304*d* and a heavily-doped drain diffusion region 309*b* of a second conductivity type formed within a common-drain diffusion region 309*a* of a first conductivity type; a planarized thick-oxide layer 318*a* is formed over each of the common-drain conductive bus lines 317*b*/316*b*; and a plurality of word lines 321*a* being formed over the planarized thick-oxide layer 318*a* are patterned and etched by a plurality of hard masking dielectric layers, wherein each of the plurality of hard masking dielectric layers includes a masking dielectric layer 322*a* being aligned to each of the plurality of active regions and two sidewall dielectric spacers 323*a* being formed over each sidewall of the masking dielectric layer 322*a*.

FIG. 7B shows a cross-sectional view along the stack-gate region as indicated by the C–C' line shown in FIG. 4H(c) and FIG. 2A(c), in which a plurality of word lines 321*a* integrated with the control-gate conductive islands 320*b*/306*b* are formed over the first intergate-dielectric layer 305*a* and are simultaneously patterned and etched by a plurality of hard masking dielectric layers, wherein each of the plurality of hard masking dielectric layers includes a masking dielectric layer 322*a* being aligned to each of the plurality of active regions and two sidewall dielectric spacers 323*a* being formed over each sidewall of the masking dielectric layer 322*a* to eliminate misalignment; and the first intergate-dielectric layer 305*a* is formed over a flat surface being alternately formed by a first raised field-oxide layer 304*b* and a tapered floating-gate layer 302*b* over a first gate-dielectric layer 301*b*.

FIG. 7C shows a cross-sectional view along the common-source conductive bus line as indicated by the D–D' line shown in FIG. 4H(c) and FIG. 2A(c), in which the common-source conductive bus line 317b/316b is formed over a first flat bed being alternately formed by an etched first raised field-oxide layer 304d and a heavily-doped source diffusion region 308b of a second conductivity type formed within a common-source diffusion region 308a of the second conductivity type; a planarized thick-oxide layer 318a is formed over each of the common-source conductive bus lines 317b/316b; and a plurality of word lines 321a being formed over the planarized thick-oxide layer 318a are patterned and etched by using a plurality of hard masking dielectric layers as described.

It should be noted that the gaps between the plurality of hard masking dielectric layers can be refilled with the planarized oxide layers as deposited by HDPCVD or CVD and the planarized oxide layer is preferably made of silicon-oxides, p-glass or BP-glass. Similarly, the stack-gate non-volatile memory devices having a tapered floating-gate structure can be easily used to implement other array architectures.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the invention.

What is claimed is:

1. A method of fabricating a stack-gate non-volatile memory device and its contactless memory array, comprising the steps of:

providing a semiconductor substrate of a first conductivity type;

forming alternately a plurality of shallow-trench-isolation (STI) regions and a plurality of active regions on said semiconductor substrate, wherein each of the plurality of STI regions is filled with a first raised field-oxide layer and each of the plurality of active regions has a first conductive layer being formed on a first gate-dielectric layer;

forming sequentially intergate-dielectric layer, a second conductive layer, and a second masking dielectric layer over a flat surface being alternately formed by said first raised field-oxide layer and said first conductive layer to form a stack-gate structure;

patterning said stack-gate structure by using a masking photoresist step to define a plurality of stack-gate regions transversely to the plurality of STI regions, wherein each of the plurality of stack-gate regions is formed between a common-source region and a common-drain region;

removing sequentially said second masking dielectric layer, said second conductive layer, and said intergate-dielectric layer and then etching anisotropically said first conductive layer in said common-source/drain regions to form a plurality of tapered floating-gate layers in each of the plurality of stack-gate regions;

forming a plurality of common-source diffusion regions in each of said common-source regions and a plurality of common-drain diffusion regions in each of said common-drain regions by separately implanting doping impurities across said first gate-dielectric layers and the plurality of tapered floating-gate layers into surface portions of said semiconductor substrate in a self-aligned manner;

removing said first gate-dielectric layers outside of the plurality of tapered floating-gate layers and etching simultaneously said first raised field-oxide layers in each of said common-source/drain regions to form exposed semiconductor-substrate surfaces and second raised field-oxide layers;

forming a first sidewall dielectric layer over each sidewall of the plurality of tapered floating-gate layers, a second sidewall dielectric layer over each sidewall of said second conductive layers, and a second gate-dielectric layer over each of the exposed semiconductor-substrate surfaces;

forming a planarized third conductive layer to fill a gap formed in each of said common-source/drain regions;

etching back anisotropically said planarized third conductive layer to a depth approximately equal to a top level of said second raised field-oxide layer to form common conductive electrodes in each of said common-source/drain regions;

forming a thermal-oxide layer over each of said common conductive electrodes to remove possible conductive material over said second raised field-oxide layers;

forming a pair of first sidewall dielectric spacers over sidewalls of nearby stack-gate regions and on side portions of a flat surface being formed alternately by said thermal-oxide layer and said second raised field-oxide layer;

etching back anisotropically said second raised field-oxide layers between the pair of first sidewall dielectric spacers to a level approximately equal to a top surface of said second gate-dielectric layer to form third raised field-oxide layers and removing simultaneously said thermal-oxide layers and then removing said common conductive electrodes between the pair of first sidewall dielectric spacers to form source/drain-sidewall conductive electrodes in each of said common-source/drain regions;

removing said second gate-dielectric layers and simultaneously etching said third raised field-oxide layers between the pair of first sidewall dielectric spacers to form a first flat bed over each of said common-source regions and a second flat bed over each of said common-drain regions;

forming a planarized fourth conductive layer between the pair of first sidewall dielectric spacers and over said first flat bed in each of said common-source regions and said second flat bed in each of said common-drain regions;

etching back selectively said planarized fourth conductive layer over said first flat bed to form a common-source conductive bus line integrated with said source-sidewall conductive electrodes in each of said common-source regions by using a masking photoresist step;

forming a planarized thick-oxide layer over said common-source conductive bus line in each of said common-source regions;

depositing a first interconnect-metal layer over said planarized fourth conductive layer in each of said common-drain regions, said second masking dielectric layer in each of the plurality of stack-gate regions, and said planarized thick-oxide layer in each of said common-source regions; and patterning and etching simultaneously said first interconnect-metal layer and said planarized fourth conductive layer integrated with said drain-sidewall conductive electrodes in each of said common-drain regions to form a plurality of bit lines integrated with a plurality of planarized fourth conductive islands, wherein each of the plurality of bit lines being formed transversely to said common-source conductive bus line is defined by a masking dielectric layer being aligned above each of the plurality of active regions and two sidewall dielectric spacers being formed over sidewalls of said masking dielectric layer.

2. The method of claim 1, wherein said second conductive layer comprises a doped polycrystalline layer or a doped polycrystalline-silicon layer capped with a tungsten silicide ($WSi_2$) layer.

3. The method of claim 1, wherein said second masking dielectric layer comprises a silicon-nitride or oxynitride layer or a composite dielectric layer comprising a silicon-nitride layer capped on a silicon-oxide layer.

4. The method of claim 1, wherein said common conductive electrodes comprises a doped polycrystalline-silicon or amorphous-silicon layer.

5. The method of claim 1, wherein said common-source conductive bus line comprises a heavily-implanted polycrystalline-silicon layer or a heavily-implanted polycrystalline-silicon layer being capped with a metal layer comprising tungsten (W) or silicided with a refractory metal-disilicide layer comprising a titanium-disilicide ($TiSi_2$) or cobalt-disilicide ($CoSi_2$) layer.

6. The method of claim 1, wherein each of the plurality of planarized fourth conductive islands comprises a heavily-implanted polycrystalline-silicon island or a heavily-implanted polycrystalline-silicon island being silicided with a refractory metal-disilicide layer comprising titanium-disilicide ($TiSi_2$) or cobalt-disilicide ($CoSi_2$) layer.

7. The method of claim 1, wherein said first sidewall dielectric layer comprises a thermal poly-oxide layer or a nitrided thermal poly-oxide layer having a thickness between 100 Angstroms and 250 Angstroms.

8. The method of claim 1, wherein said first interconnect-metal layer comprises an aluminum (Al), tungsten (W) or copper (Cu) layer being formed on a barrier-metal layer comprising a titanium-nitride (TiN) or tantalum-nitride (TaN) layer.

9. The method of claim 1, wherein each of the plurality of common-drain diffusion regions comprises a heavily-doped drain diffusion region of said second conductivity type formed within a moderately-doped or lightly-doped drain diffusion region of said first or second conductivity type.

10. The method of claim 1, wherein each of the plurality of common-source diffusion regions comprises a heavily-doped source diffusion region of said second conductivity type formed within a lightly-doped source diffusion region of said second conductivity type.

11. A method of fabricating a stack-gate non-volatile memory device and its contactless memory array, comprising the steps of:

providing a semiconductor substrate of a first conductivity type;

forming alternately a plurality of STI regions and a plurality of active regions on said semiconductor substrate, wherein each of the plurality of STI regions is filled with a first raised field-oxide layer and each of the plurality of active regions has a first conductive layer being formed on a first gate-dielectric layer;

forming sequentially an intergate-dielectric layer, a second conductive layer, and a second masking dielectric layer over a flat surface being alternately formed by said first raised field-oxide layer and said first conductive layer to form a stack-gate structure;

patterning said stack-gate structure by using a masking photoresist step to define a plurality of stack-gate regions transversely to the plurality of STI regions;

wherein each of the plurality of stack-gate regions is formed between a common-source region and a common-drain region;

removing sequentially said second masking dielectric layer, said second conductive layer, and said intergate-dielectric layer and then etching anisotropically said first conductive layer in said common-source/drain regions to form a plurality of tapered floating-gate layers in each of the plurality of stack-gate regions;

forming a plurality of common-source/drain diffusion regions of a second conductivity type in each of said common-source/drain regions by implanting doping impurities across said first gate-dielectric layers and the plurality of tapered floating-gate layers into surface portions of said semiconductor substrate in a self-aligned manner;

removing said first gate-dielectric layers outside of the plurality of tapered floating-gate layers and etching simultaneously said first raised field-oxide layers in each of said common-source/drain regions to form exposed semiconductor-substrate surfaces and second raised field-oxide layers;

forming a first sidewall dielectric layer over each sidewall of the plurality of tapered floating-gate layers, a second sidewall dielectric layer over each sidewall of said second conductive layers, and a second gate-dielectric layer over each of said exposed semiconductor-substrate surfaces;

forming a planarized third conductive layer to fill a gap formed in each of said common-source/drain regions;

etching back anisotropically said planarized third conductive layer to a depth approximately equal to or smaller than a top surface level of said second raised field-oxide layer to form common conductive electrodes in each of said common-source/drain regions;

forming a thermal-oxide layer over each of said common conductive electrodes to remove possible conductive material over said second raised field-oxide layers;

forming a pair of first sidewall dielectric spacers over sidewalls of nearby stack-gate regions and on side portions of a flat surface being formed alternately by said thermal-oxide layer and said second raised field-oxide layer;

etching back sequentially said thermal-oxide layers, said common conductive electrodes, and said second gate-dielectric layers between the pair of first sidewall dielectric spacers to form source/drain-sidewall conductive electrodes in each of said common-source/drain regions, wherein said second raised field-oxide layers are simultaneously etched to form third raised field-oxide layers;

forming a planarized fourth conductive layer to fill a gap in each of said common-source/drain regions;

etching back said planarized fourth conductive layer to a level slightly below a top surface of said third raised field-oxide layers to form self-registered common-source/drain conductive islands being integrated with said source/drain-sidewall conductive electrodes and formed on the plurality of common-source/drain diffusion regions in each of said common-source/drain regions;

forming a planarized thick-oxide layer over said third raised field-oxide layers and said self-registered common-source/drain conductive islands in each of said common-source/drain regions;

depositing a first interconnect-metal layer over said planarized thick-oxide layers in each of said common-source/drain regions and said second masking dielectric layer in each of the plurality of stack-gate regions; and patterning and etching said first interconnect-metal layer to form a plurality of bit lines, wherein each of the plurality of bit lines being formed transversely to a plurality of word lines formed by elongated second conductive layers is defined by a masking dielectric layer being aligned above each of the plurality of active regions and two sidewall dielectric spacers being formed over sidewalls of said masking dielectric layer.

12. The method of claim 11, wherein each of the plurality of bit lines being integrated with a plurality of planarized common-drain conductive islands formed over the plurality of common-drain diffusion regions of drain select-transistors is simultaneously patterned and etched.

13. The method of claim 11, wherein a plurality of common-source conductive bus lines being formed transversely to the plurality of STI regions are formed over said first flat beds with each of said first flat beds being alternately formed by fourth raised field-oxide layer and a common-source diffusion region of source select-transistors.

14. The method of claim 11, wherein each of said self-aligned common-source/drain conductive islands comprises a heavily-implanted polycrystalline-silicon island or a heavily-implanted polycrystalline-silicon island silicided with a refractory metal-disilicide layer comprising a cobalt-disilicide ($CoSi_2$) or titanium disilicide ($TiSi_2$) layer.

15. The method of claim 11, wherein each of elongated second conductive layers being acted as a word line comprises a doped polycrystalline-silicon layer or a doped polycrystalline-silicon layer capped with a tungsten-disilicide ($WSi_2$) layer.

16. The method of claim 11, wherein each of common conductive electrode is made of doped polycrystalline-silicon or doped amorphous-silicon.

17. A method of fabricating a stack-gate non-volatile memory device and its contactless memory array, comprising the steps of:

providing a semiconductor substrate of a first conductivity type;

forming alternately a plurality of shallow-trench-isolation (STI) regions and a plurality of active regions on said semiconductor substrate, wherein each of the plurality of STI regions is filled with a first raised field-oxide layer and each of the plurality of active regions has a first conductive layer being formed on a first gate-dielectric layer;

forming sequentially an intergate-dielectric layer, a second conductive layer, and a second masking dielectric layer over a flat surface being alternately formed by said first raised field-oxide layer and said first conductive layer to form a stack-gate structure;

patterning said stack-gate structure by using a masking photoresist step to define a plurality of stack-gate regions transversely to the plurality of STI regions, wherein each of the plurality of stack-gate regions is formed between a common-source region and a common-drain region;

removing sequentially said second masking dielectric layer, said second conductive layer, and said intergate-dielectric layer and then etching anisotropically said first conductive layer in each of said common-source/drain regions to form a plurality of tapered floating-gate layers in each of the plurality of stack-gate regions;

forming a plurality of common-source diffusion regions in each of said common-source regions and a plurality of common-drain diffusion regions in each of said common-drain regions by separately implanting doping impurities across said first gate-dielectric layers and the plurality of tapered floating-gate layers into surface portions of said semiconductor substrate in a self-aligned manner;

removing said first gate-dielectric layers outside of the plurality of tapered floating-gate layers and etching simultaneously said first raised field-oxide layers to form exposed semiconductor-substrate surfaces and second raised field-oxide layers in each of said common-source/drain regions;

forming a first sidewall dielectric layer over each sidewall of the plurality of tapered floating-gate layers, a second sidewall dielectric layer over each sidewall of said second conductive layers, and a second gate-dielectric layer over each of the exposed semiconductor-substrate surfaces;

forming a planarized third conductive layer to fill a gap in each of said common-source/drain regions;

etching back anisotropically said planarized third conductive layer to a depth approximately equal to a top surface level of said second raised field-oxide layer to form common conductive electrodes in each of said common-source/drain regions;

forming a thermal-oxide layer over each of said common conductive electrodes to remove possible conductive material over said second raised field-oxide layers in each of said common-source/drain regions;

forming a pair of first sidewall dielectric spacers over sidewalls of nearby stack-gate regions and on side portions of a flat surface being formed alternately by said thermal-oxide layer and said second raised field-oxide layer in each of said common-source/drain regions;

etching back anisotropically said second raised field-oxide layers between the pair of first sidewall dielectric spacers to a level approximately equal to a toy surface of said second gate-dielectric layer to form third raised field-oxide layers and removing simultaneously said thermal-oxide layers and then removing said common conductive electrodes to form source/drain-sidewall conductive electrodes in each of said common-source/drain regions;

removing said second gate-dielectric layers and simultaneously etching said third raised field-oxide layers between the pair of first sidewall dielectric spacers to form a first flat bed in each of said common-source regions and a second flat bed in each of said common-drain regions;

forming a planarized fourth conductive layer between the pair of first sidewall dielectric spacers and on each of said first/second flat beds;

etching back said planarized fourth conductive layer to form a common-source/drain conductive bus line integrated with said source/drain-sidewall conductive electrodes in each of said common-source/drain regions;

forming a planarized thick-oxide layer over each of said common-source/drain conductive bus lines;

removing selectively said second masking dielectric layers said second conductive layers in the plurality of stack-gate regions by using anisotropic dry etching;

forming a planarized fifth conductive layer over each of said second conductive layers in each of the plurality of stack-gate regions;

depositing a first interconnect-metal layer over said planarized fifth conductive layer in each of the plurality of stack-sate regions and said planarized thick-oxide layer in each of said common-source/drain regions; and patterning and etching said interconnect-metal layer, said fifth conductive layers, and said second conductive layers simultaneously to form a plurality of word lines integrated with a plurality of planarized control-gate conductive islands, wherein each of the plurality of word lines being formed transversely to said common-source/drain bus lines is defined by a masking dielectric layer being aligned above each of the plurality of active regions and two sidewall dielectric spacers being formed over sidewalls of said masking dielectric layer.

18. The method of claim 17, wherein each of said common-source/drain conductive bus lines comprises a heavily-implanted polycrystalline-silicon layer or a heavily-implanted polycrystalline-silicon layer capped with a tungsten-disilicide (WSi$_2$) layer or silicided with a refractory metal-disilicide layer comprising a titanium-disilicide (TiSi$_2$) or cobalt-disilicide (CoSi$_2$) layer.

19. The method of claim 17, wherein said planarized fifth conductive layer comprises a tungsten (W) or tungsten-disilicide(WSi$_2$) layer formed over a barrier-metal layer and said second conductive layer comprises a doped polycrystalline-silicon layer.

20. The method of claim 17, wherein each of the plurality of common-drain diffusion region comprises a heavily-doped drain diffusion region of said second conductivity type formed within a moderately-doped or lightly-doped drain diffusion region of said first or said second conductivity type and each of the plurality of common-source diffusion region comprises a heavily-doped source diffusion region of said second conductivity type formed within a lightly-doped source diffusion region of said second conductivity type.

* * * * *